(12) United States Patent
Kriman et al.

(10) Patent No.: US 10,147,750 B2
(45) Date of Patent: Dec. 4, 2018

(54) OPTICAL IMAGING APPARATUS AND METHODS OF MAKING THE SAME

(75) Inventors: Moshe Kriman, Charlotte, NC (US);
William Hudson Welch, Charlotte, NC (US); Giles Humpston, San Jose, CA (US); Osher Avsian, Huntersville, NC (US); Felix Hazanovich, Tel-Aviv (IL); Ekaterina Axelrod, Tel-Aiv (IL)

(73) Assignee: FLIR Systems Trading Belgium BVBA, Meer (BE)

( * ) Notice: Subject to any disclaimer, the term of this patent is extended or adjusted under 35 U.S.C. 154(b) by 0 days.

(21) Appl. No.: 13/145,830

(22) PCT Filed: Feb. 3, 2010

(86) PCT No.: PCT/US2010/022999
§ 371 (c)(1),
(2), (4) Date: Jul. 22, 2011

(87) PCT Pub. No.: WO2010/091053
PCT Pub. Date: Aug. 12, 2010

(65) Prior Publication Data
US 2011/0273600 A1    Nov. 10, 2011

Related U.S. Application Data

(60) Provisional application No. 61/149,558, filed on Feb. 3, 2009.

(51) Int. Cl.
*H04N 5/232* (2006.01)
*H01L 27/146* (2006.01)
*H04N 5/225* (2006.01)

(52) U.S. Cl.
CPC .. *H01L 27/14618* (2013.01); *H01L 27/14625* (2013.01); *H01L 27/14683* (2013.01); *H01L 2224/051* (2013.01); *H01L 2224/05001* (2013.01); *H01L 2224/056* (2013.01); *H01L 2224/05009* (2013.01); *H01L 2224/0557* (2013.01); *H01L 2224/13* (2013.01); *H01L 2224/13025* (2013.01); *H04N 5/2254* (2013.01)

(58) Field of Classification Search
None
See application file for complete search history.

(56) References Cited

U.S. PATENT DOCUMENTS

| | | | | |
|---|---|---|---|---|
| 6,791,072 | B1 * | 9/2004 | Prabhu | 250/208.1 |
| 7,329,861 | B2 * | 2/2008 | Ma et al. | 250/239 |
| 7,663,083 | B2 * | 2/2010 | Kwon et al. | 250/208.1 |

(Continued)

FOREIGN PATENT DOCUMENTS

WO    WO 2004/027880 A2    4/2004

OTHER PUBLICATIONS

Patent Cooperation Treaty, Notification Concerning Transmittal of International Preliminary Report on Patentability, Application No. PCT/US2010/02299, dated Aug. 18, 2011.

(Continued)

*Primary Examiner* — Twyler Haskins
*Assistant Examiner* — Wesley Chiu
(74) *Attorney, Agent, or Firm* — Haynes and Boone, LLP

(57) ABSTRACT

The present invention provides optical imaging apparatus comprising solid state sensing elements and optical components operable to be manufactured and assembled at the wafer level.

30 Claims, 15 Drawing Sheets

(56) References Cited

U.S. PATENT DOCUMENTS

| | | | |
|---|---|---|---|
| 7,741,652 B2* | 6/2010 | Lee | G02B 7/02 257/432 |
| 8,482,926 B2* | 7/2013 | Yano | G02B 3/0062 361/728 |
| 2004/0095502 A1* | 5/2004 | Losehand et al. | 348/340 |
| 2005/0077458 A1 | 4/2005 | Ma et al. | |
| 2005/0110889 A1* | 5/2005 | Tuttle | H01L 27/14618 348/340 |
| 2006/0011809 A1 | 1/2006 | Farnworth et al. | |
| 2006/0044450 A1* | 3/2006 | Wolterink | G02B 13/006 348/340 |
| 2008/0121784 A1* | 5/2008 | Chang et al. | 250/208.1 |
| 2008/0122055 A1 | 5/2008 | Perkins | |
| 2008/0290435 A1 | 11/2008 | Oliver et al. | |
| 2009/0032925 A1* | 2/2009 | England | H01L 27/14618 257/680 |
| 2009/0161006 A1* | 6/2009 | Lee | 348/374 |
| 2009/0174947 A1* | 7/2009 | Hasegawa | B32B 38/0004 359/642 |
| 2009/0321863 A1* | 12/2009 | Borthakur et al. | 257/432 |

OTHER PUBLICATIONS

Patent Cooperation Treaty, International Search Report, Application No. PCT/US2010/02299, dated May 19, 2010.

* cited by examiner

OPTICAL IMAGING APPARATUS AND METHODS OF MAKING THE SAME

RELATED APPLICATION DATA

The present application is a U.S. national stage under 35 U.S.C. § 317 of International Patent Application No. PCT/US2010/022999, filed Feb. 3, 2010, which claims priority pursuant to 35 U.S.C. § 119(e) to U.S. Provisional Patent Application Ser. No. 61/149,558, filed Feb. 3, 2009, each of which is hereby incorporated by reference in its entirety.

FIELD OF THE INVENTION

The present invention relates to optical imaging apparatus including cameras and methods of making the same.

BACKGROUND OF THE INVENTION

Optical imaging apparatus incorporating solid state sensing elements find application in a variety of fields ranging from military reconnaissance and surveillance to consumer electronics. Solid state cameras, for example, are used in a number of consumer electronics including cell phones, digital still cameras, computers, toys and automotive driver aids. In order to satisfy demand, solid state cameras are required to be manufactured in significant quantities. In 2008, for example, it is expected that the number of solid state cameras produced worldwide will reach around 2.5 million per day. In view of these numbers, efficient and low cost manufacture of solid state cameras is of high importance.

Traditionally, solid state camera modules are manufactured as discrete units. In such manufacturing, an image sensor is attached to a substrate by adhesive and interconnected to the substrate by wire bonds. Optical components of the camera are separately mounted in a lens turret. A barrel is subsequently attached to the substrate, and the lens turret is inserted into the barrel by means of a screw thread to position the optical components over the image sensor.

A disadvantage of the foregoing manufacturing technique is that each camera module is effectively made serially. Manufacturing solid state camera modules in a serial format can significantly increase costs and time of manufacture. Such inefficiencies are only magnified when producing high volumes of camera modules.

SUMMARY

The present invention provides optical imaging apparatus comprising solid state sensing elements and optical components operable to be manufactured and assembled at the wafer level. Wafer level assembly of solid state sensing elements and optical components, in some embodiments, can offer cost and time efficient production of optical imaging apparatus including solid state camera modules.

In some embodiments, the present invention provides an optical imaging apparatus comprising a first optical subassembly comprising a radiation transmissive substrate comprising at least one optical surface and a spacer and a sensor subassembly comprising at least one sensing element and a spacer, wherein the spacer of the first optical subassembly is coupled to the spacer of the sensor subassembly. In some embodiments, a first optical subassembly comprises an optical element wherein one or more optical surfaces are not supported by a radiation transmissive substrate.

In some embodiments, the optical subassembly comprises a plurality of spacers, and the sensor subassembly comprises a plurality of spacers. In such embodiments, the plurality of optical subassembly spacers are coupled to the plurality of sensor subassembly spacers. In other embodiments, the sensor subassembly does not comprise a spacer and the spacer of the optical subassembly is coupled to the sensing element or a coverglass of the sensing element.

In some embodiments, an optical imaging apparatus of the present invention further comprises at least one additional optical subassembly comprising an additional radiation transmissive substrate comprising at least one optical surface and an additional spacer. The at least one additional optical subassembly is coupled to the first optical subassembly or an adjacent optical subassembly through the additional spacer. In some embodiments, the at least one additional optical subassembly comprises a plurality of additional spacers wherein the additional spacers are coupled to the first optical subassembly or an adjacent optical subassembly.

In other embodiments, an optical subassembly of an optical imaging apparatus comprises a plurality of optical elements. In some embodiments, for example, a plurality of optical elements are coupled to the spacer of the optical subassembly.

In some embodiments, optical imaging apparatus of the present invention comprise solid state camera modules.

In another aspect, the present invention provides methods of making optical imaging apparatus. As described further herein, methods of the present invention, in some embodiments, can overcome disadvantages of prior serial manufacturing practices by providing a plurality of individual optical imaging apparatus through wafer assembly and singulation techniques.

In one embodiment, a method of making a plurality of individual optical imaging apparatus comprises providing a wafer comprising a plurality of optical subassemblies, the optical subassemblies comprising a radiation transmissive substrate having at least one optical surface and a spacer and providing a sensor wafer comprising a plurality of sensor subassemblies, the sensor subassemblies comprising a sensing element and a spacer. The spacer of the optical subassemblies is coupled to the spacer of the sensor subassemblies to provide a plurality of joined optical imaging apparatus. The joined optical imaging apparatus are singulated to provide the plurality of individual optical imaging apparatus. In some embodiments, one or more optical surfaces of an optical subassembly are not supported by a radiation transmissive substrate.

In another embodiment, a method of making a plurality of individual optical imaging apparatus comprises providing a wafer comprising a plurality of optical subassemblies, the optical subassemblies comprising a radiation transmissive substrate having at least one optical surface and singulating the plurality of optical subassemblies. The singulated optical subassemblies are subsequently coupled to one another with a spacer. A sensor wafer is provided comprising a plurality of sensor subassemblies, the sensor subassemblies comprising a sensing element and a spacer. The spacer of the optical subassemblies is coupled to the spacer of the sensor subassemblies to provide a plurality of joined optical imaging apparatus. The joined optical imaging apparatus are singulated to provide a plurality of individual optical imaging apparatus. In some embodiments, one or more optical surfaces of an optical subassembly are not supported by a radiation transmissive substrate.

A method of making a plurality of individual optical imaging apparatus, in another embodiment, comprises providing a plurality of singulated optical elements, providing a spacer wafer comprising a plurality of recesses and at least partially disposing the plurality of singulated optical elements in the plurality of recesses of the spacer wafer. Disposing an optical element in the recess of the spacer wafer provides an optical subassembly. Disposing a plurality of optical elements in the plurality of recesses of the spacer wafer provides a plurality of joined optical subassemblies. As described further herein, in some embodiments, an optical subassembly comprises optical elements in a stacked configuration.

A sensor wafer comprising a plurality of sensing elements is provided. A spacer wafer is coupled to the sensor wafer to provide a plurality of sensor subassemblies, a sensor subassembly comprising a sensing element and a spacer as described herein. The spacer wafer of the optical subassemblies is coupled to the spacer wafer of the sensor subassemblies to provide a plurality of joined optical imaging apparatus. The joined optical imaging apparatus are singulated to provide a plurality of optical imaging apparatus.

In another aspect, the present invention provides a method of imaging a scene. In one embodiment, a method of imaging a scene comprises providing an optical imaging apparatus comprising a first optical subassembly comprising a radiation transmissive substrate having at least one optical surface and a spacer and a sensor subassembly comprising at least one sensing element and a spacer, wherein the spacer of the first optical subassembly is coupled to the spacer of the sensor subassembly and receiving electromagnetic radiation from the scene. The received electromagnetic radiation passes through the first optical subassembly and is detected by the sensing element. The sensing element translates the received electromagnetic radiation into an electrical response for constructing an electronic image of the scene. In some embodiments of imaging a scene, optical surfaces of an optical imaging apparatus are not supported by a radiation transmissive substrate. In some embodiments of imaging a scene, the optical imaging apparatus comprises a solid state camera.

These and other embodiments are described in greater detail in the detailed description which follows.

DETAILED DESCRIPTION

Figure 1:
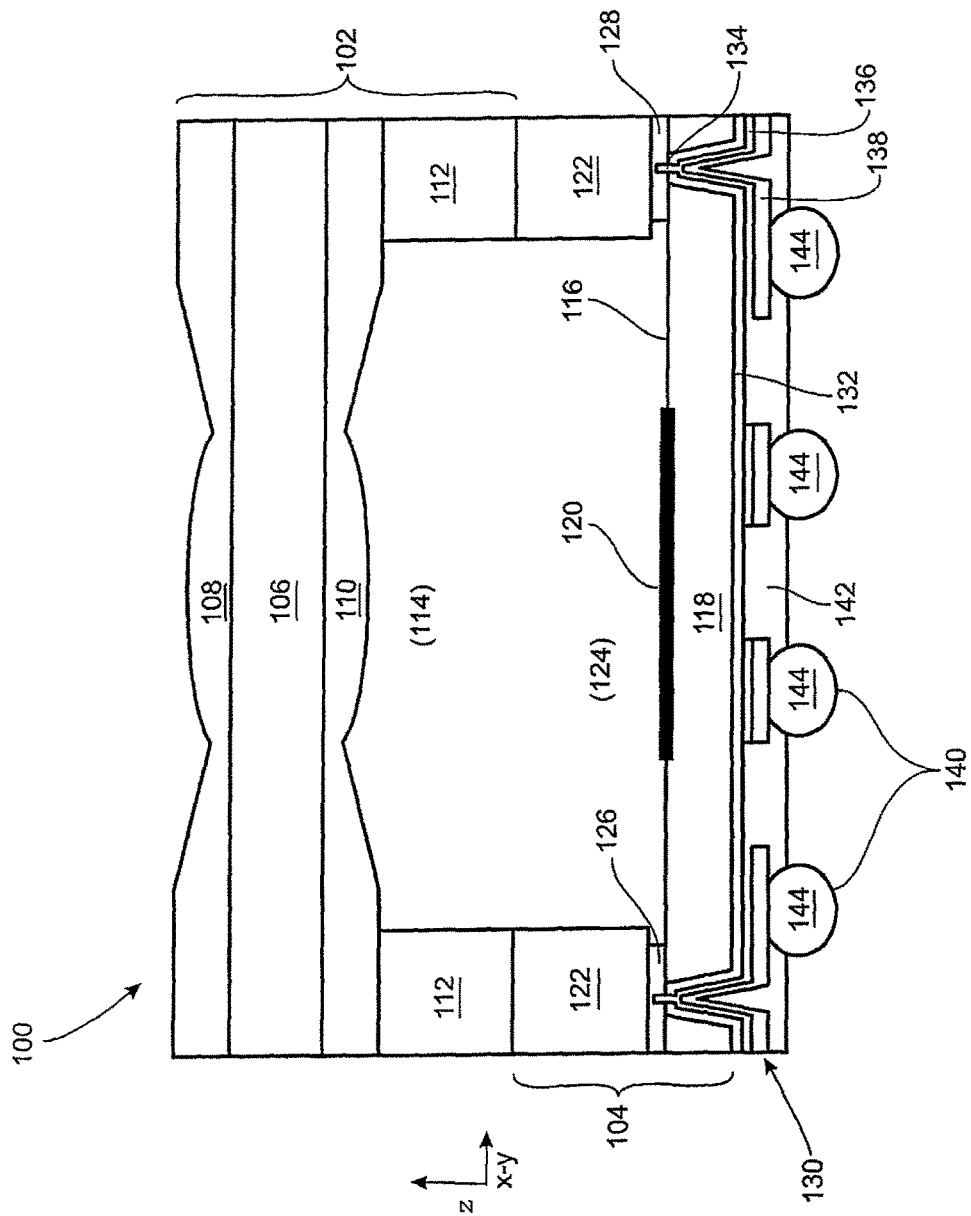
FIG. 1 illustrates an optical imaging apparatus according to one embodiment of the present invention.

The present invention can be understood more readily by reference to the following detailed description, examples and drawings and their previous and following descriptions. Elements, apparatus and methods of the present invention, however, are not limited to the specific embodiments presented in the detailed description, examples and drawings. It should be recognized that these embodiments are merely illustrative of the principles of the present invention. Numerous modifications and adaptations will be readily apparent to those of skill in the art without departing from the spirit and scope of the invention.

The present invention provides optical imaging apparatus comprising solid state sensing elements and optical components operable to be manufactured and assembled at the wafer level. Wafer level assembly of solid state sensing elements and optical components, in some embodiments, can offer cost and time efficient production of optical imaging apparatus including solid state camera modules.

In some embodiments, the present invention provides an optical imaging apparatus comprising a first optical subassembly comprising a radiation transmissive substrate comprising at least one optical surface and a spacer and a sensor subassembly comprising at least one sensing element and a spacer, wherein the spacer of the first optical subassembly is coupled to the spacer of the sensor subassembly to establish an overall spacing between the optical surface and the sensor.

In being assembled at the wafer level, the spacer of the first optical subassembly, in some embodiments, is a singulated section of an optical subassembly spacer wafer. In other embodiments, the spacer of the first optical subassembly is a singulated section of an optical wafer comprising the at least one optical surface. In some embodiments, wherein the spacer of the first optical subassembly is a singulated section of an optical wafer, the spacer and the optical wafer are provided as an integral or monolithic structure. In some embodiments, the radiation transmissive substrate comprising the at least one optical surface is a singulated section of an optical wafer. Moreover, in some embodiments, the spacer of the sensor subassembly is a singulated section of a sensor subassembly spacer wafer. The spacer of the sensor subassembly, in some embodiments, does not include a coverglass or other protective covering of the sensing element. In other embodiments, a coverglass or other protective covering can be part of the spacer of the sensor subassembly.

Radiation transmissive, as used herein, refers to the ability to at least partially pass radiation in the visible, infrared, and/or ultraviolet region of the electromagnetic spectrum. In some embodiments, radiation transmissive materials can pass visible electromagnetic radiation with minimal absorbance or other interference. In some embodiments, materials with varying or consistent dispersion (Abbe number) may be used to achieve desired lens characteristics. It should also be understood that the radiation transmission materials may have varying or consistent refractive indices to achieve desired lens characteristics.

In some embodiments, a first optical subassembly comprises an optical element wherein one or more optical surfaces are not supported by a radiation transmissive substrate.

In some embodiments, an optical subassembly comprises a plurality of spacers, and the sensor subassembly comprises a plurality of spacers. In such embodiments, the plurality of optical subassembly spacers are coupled to the plurality of sensor subassembly spacers.

Moreover, in some embodiments, an optical subassembly comprises a plurality of optical surfaces. In some embodiments, a plurality of optical surfaces are supported on a radiation transmissive substrate. In other embodiments, a plurality of optical surfaces are not supported on a radiation transmissive substrate. In some embodiments wherein optical surfaces are not supported by a radiation transmissive substrate, the optical surfaces are part of a monolithic structure as in the case, for example, of molded polymeric or glass optical wafers.

Referring now to the Figures, FIG. 1 illustrates a cross-sectional view of an optical imaging apparatus according to one embodiment of the present invention. The optical imaging apparatus (100) of FIG. 1 comprises an optical subassembly (102) and a sensor subassembly (104). The optical subassembly (102) comprises a radiation transmissive substrate (106) comprising a plurality of optical surfaces (108, 110). The optical subassembly (102) also comprises a spacer (112). The spacer (112) comprises an aperture (114) aligned with the plurality of optical surfaces (108, 110). In comprising an aperture (114) aligned with the optical surfaces (108, 110), the spacer does not interfere with radiation passing through the plurality of optical surfaces (108, 110).

As illustrated in FIG. 1, spacer (112) is a singulated section of a spacer wafer coupled to the radiation transmissive substrate (106) comprising optical surfaces (108, 110). In other embodiments, spacer (112) and the radiation transmissive substrate (106) comprising optical surfaces (108, 110) are provided as a continuous or monolithic structure. In one embodiment, for example, spacer (112) is a continuous part of a molded optical wafer comprising the radiation transmissive substrate having optical surfaces (108, 110).

In the embodiment illustrated in FIG. 1, the plurality of optical surfaces (108, 110) are in facing opposition to one another on opposite surfaces of the radiation transmissive substrate (106). In some embodiments, optical surfaces (108, 110) are lenses or other optical elements, such as diffractive elements, filters, apertures, or other refractives operable to interact with electromagnetic radiation. In some embodiments, the optical surfaces (108, 110) are formed onto the substrate (106) during simultaneous or sequential processing steps. For example, the optical surfaces (108, 110) may be molded or replicated onto the substrate (106). The optical surfaces (108, 110) may be formed in similar or different materials having different refractive indices and dispersion values as compared to each other or compared to the substrate (106). In some embodiments, the optical surfaces (108, 110) are formed into the substrate (106) using lithographic or molding processes.

The sensor subassembly (104) comprises at least one sensing element (116) and a spacer (122). The spacer (122) of the sensor wafer comprises an aperture (124) aligned with the sensing element (116). In the embodiment illustrated in FIG. 1, the sensing element (116) comprises a semiconductor wafer (118) having a photosensitive region (120) operable to detect electromagnetic radiation received by the optical imaging apparatus (100). In comprising an aperture (124) aligned with the sensing element (116), the spacer (122), in some embodiments, does not interfere with electromagnetic radiation being passed by the optical surfaces (108, 110) to the sensing element (116). In some embodiments, the optical surfaces (108, 110) of the optical subassembly (102) focus the electromagnetic radiation on or near the photosensitive region (120) of the sensing element.

In some embodiments, the spacer (122) is coupled to bond pads (126, 128) of the sensing element (116) by one or more adhesive materials. In some embodiments, bond pads (126, 128) are part of spacer (122).

As discussed further herein, the spacer (122) of the sensor subassembly can have various constructions. In one embodiment, for example, the spacer (122) is formed as a solder mask on sensing element (116). In another embodiment, the spacer (122) is fixated from a non-conductive or insulating material on sensing element (116). Any non-conductive or insulating material not inconsistent with the objectives of the present invention can be used. In some embodiments, a non-conductive or insulating material comprises liquid crystal polymer(s) (LCP), fiber reinforced plastics and/or other polymeric species.

In some embodiments, the spacer (122) comprises a composite construction of two or more materials. The composite construction, in some embodiments, comprises two or more materials coupled to one another. The spacer (122), in some embodiments, has a composite construction comprising a solder mask coupled to bond pads. In another embodiment, the spacer (122) has a composite construction comprising a solder mask coupled to a silicon spacing material. In some embodiments, a spacer (122) comprising a solder mask coupled to a silicon spacing material further comprises one or more bond pads coupled to the solder mask.

In some embodiments, the sensor subassembly (104) further comprises an optical surface (not shown) disposed on a surface of the photosensitive region (120) of the sensing element (116). In some embodiments, the optical surface at least partially covers the photosensitive region (120) of the sensing element (116). In some embodiments, an optical surface disposed on a surface of the photosensitive region (120) comprises one or more microlens structures.

As illustrated in FIG. 1, spacer (112) of the optical subassembly is coupled to spacer (122) of the sensor subassembly (104). The combined height of an optical subassembly spacer (112) and the sensor subassembly spacer (122) can be set to any desired value. In some embodiments, for example, the combined height of an optical subassembly spacer (112) and a sensor subassembly spacer (122) is set to provide the desired focal length or other optical parameter of the optical imaging apparatus (100). The focal length of an optical imaging apparatus, for example, can be determined with reference to the one or more optical surfaces of the optical subassembly.

In some embodiments, the combined height of an optical subassembly spacer (112) and a sensor subassembly spacer (122) is at least about 1 mm. In other embodiments, the combined height of an optical subassembly spacer (112) and a sensor subassembly spacer (122) is up to about 1 mm. In another, such as where the sensor size is sufficiently small or additional optical surfaces (not shown) are included in the lens design, the combined height of an optical subassembly spacer and a sensor subassembly spacer ranges from about 250 µm to about 1.0 mm. In some embodiments, such as with larger sensors, the combined height of an optical subassembly spacer and a sensor subassembly spacer ranges from about 1.0 mm to about 1.5 mm or from about 1.5 mm to about 2 mm. In a further embodiment, the combined height of an optical subassembly spacer and a sensor subassembly spacer is less than about 250 µm or greater than about 2 mm.

In the embodiment illustrated in FIG. 1, the optical subassembly spacer (112) displays the same or substantially the same height as the sensor subassembly spacer (122). In some embodiments, however, the optical subassembly spacers do not have the same or substantially the same height as the sensor spacers. In one embodiment, an optical subassembly spacer has a height greater than a sensor subassembly spacer. In another embodiment, a sensor subassembly spacer has a height greater than an optical subassembly spacer.

As illustrated in FIG. 1, an optical apparatus of the present invention can further comprise an electrical circuit coupled to the sensor subassembly (104). In some embodiments, the electrical circuit is an input/output (I/O) circuit for communicating with the sensing element. In some embodiments, the electrical circuit (130) comprises an encapsulant (132), such as an electrophoretic coating (E-coat) on the side of the sensing element (116) opposing the photosensitive region (120). The electrical circuit also comprises through silicon via (TSV) (134) of sputtered metal (136) on the encapsulant (132) terminating at or through/within the bond pads (126, 128)/solder mask structure between the sensing element (116) and sensor subassembly spacer (122). The sputtered metal in some embodiments, is deposited in conjunction with lithographic techniques to provide the initial pattern of a ball grid array interface. The TSV (134) is plated with an additional metal (138) such as lead and a ball grid array (140) completes the electric circuit (130). Another encapsulant (142), such as a polymer or other sealant material, fills between individual contacts (144) of the ball grid array (140).

In some embodiments, the electrical circuit (130) does not comprise one or more TSVs and employs one or more edge-connect architectures.

In some embodiments, electrical circuits coupled to the sensing element of an optical apparatus of the present invention are consistent with the electrical circuits of the SHELLCASE® technologies, including for example the SHELLCASE® MVP through via contact and SHELLCASE® OP, OC, or RT edge contact technologies, commercially available from Tessera Inc. of San Jose, Calif.

Figure 9:
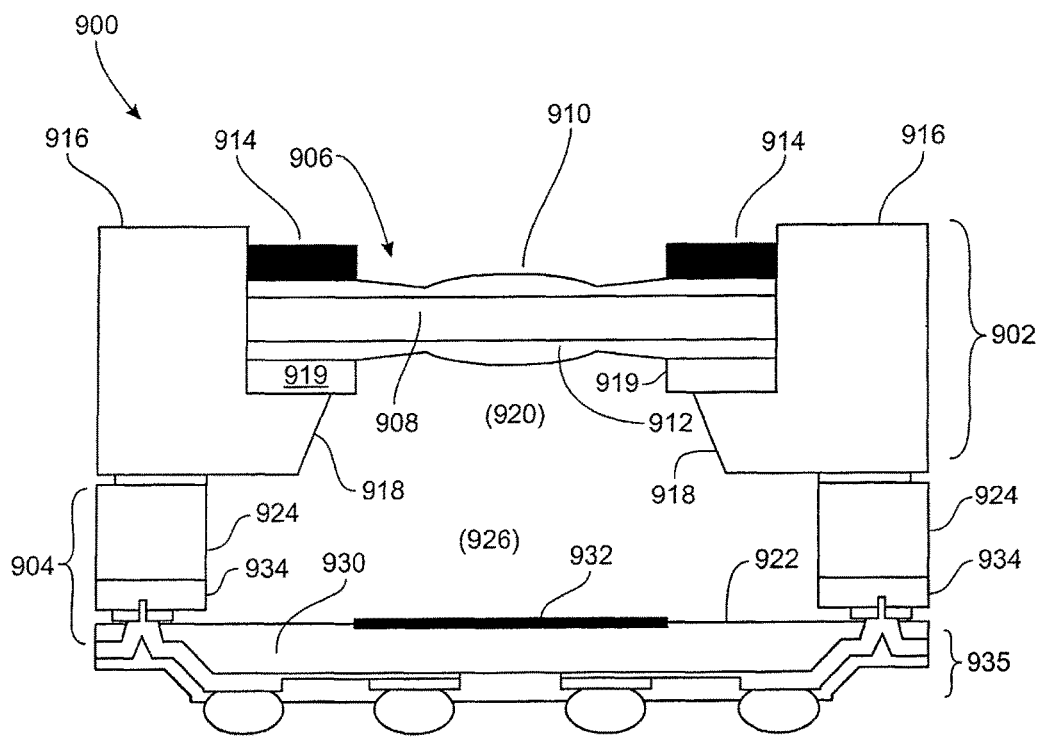
FIG. 9 illustrates an optical imaging apparatus according to one embodiment of the present invention.

FIG. 9 illustrates a cross-sectional view of an optical imaging apparatus according to another embodiment of the present invention. The optical imaging apparatus (900) illustrated in FIG. 9 comprises an optical subassembly (902) and a sensor subassembly (904). The optical subassembly (902) comprises an optical element (906), the optical element comprising a radiation transmissive substrate (908) having a plurality of optical surfaces (910, 912). A baffle (914), in some embodiments, is disposed on optical surface (910). In some embodiments, baffle (914) is operable to adjust the amount of radiation passing through the optical subassembly (902). The optical subassembly (902) also comprises a spacer (916). The spacer (916) comprises an aperture (920) aligned with the plurality of optical surfaces (910, 912). In comprising an aperture (920), the spacer (916), in some embodiments, does not interfere with radiation passing through the plurality of optical surfaces (910, 912).

In the embodiment illustrated in FIG. 9, the spacer (916) is additionally a holder for the optical element (906). The spacer/holder (916), for example, comprises a recess or interior having flange or projection (918) on which the optical element (906) can be seated. In the embodiment illustrated in FIG. 9, the optical element (906) fits within the spacer/holder (916). In other embodiments, the optical element (906) can at least partially fit within the spacer/holder (916).

In some embodiments, the spacer/holder (916) can have a shape operable to adjust the amount of radiation passing through the optical subassembly (902), thereby functioning as a baffle, light shield or aperture stop. In some embodiments, the spacer/holder (916) can have shape operable to further restrict the amount of radiation passing through the optical subassembly (902). In other embodiments, the shape of the spacer/holder (916) does not further restrict the amount radiation passing through the optical subassembly (902). In one embodiment, for example, the flange or projection (918) can function as a baffle to adjust the amount of radiation passing through the optical subassembly. For example, the aperture (920) may have a circular, rectangular, elliptical or other shape formed by the flange or projection (918) to restrict the amount of radiation passing through the optical subassembly (902).

In some embodiments, the spacer/holder (916) provides or assists in providing the proper alignment of the optical element (906) with the photosensitive region (932) of the sensing element (922).

In some embodiments, the optical subassembly (902) further comprises a focus spacer (919). A focus spacer (919), in some embodiments, has dimensions suitable for setting the optical element (906) at the desired distance or height from an image plane such as to set the focal point of the optical element (906) at or near the image plane of the sensing element. A focus spacer (919), in some embodiments, is disposed between the optical element (906) and the spacer/holder (916). In some embodiments, a focus spacer (919) is independent of the spacer/holder (916) and the optical element (906) and is subsequently coupled to the spacer/holder (916) and/or the optical element (906). In another embodiment, a focus spacer (919) is continuous with the spacer/holder (916) or the optical element (906).

The sensor subassembly (904) comprises at least one sensing element (922) and a spacer (924) The spacer (924) of the sensor subassembly comprises an aperture (926) aligned with the sensing element (922). In the embodiment illustrated in FIG. 9, the sensing element (922) comprises a semiconductor wafer (930) having a photosensitive region (932) operable to detect electromagnetic radiation received by the optical imaging apparatus (900). In comprising an aperture (926) aligned with the sensing element (922), the spacer (924), in some embodiments, does not interfere with electromagnetic radiation passed by the optical element (906) to the sensing element (922). In other embodiments, the shape of the aperture (926) formed within spacer (924) may serve to restrict the amount of radiation passing through to the sensing element (922).

In some embodiments, the spacer (924) is coupled to bond pads (934) of the sensing element (922) by one or more adhesive materials. In some embodiments, bond pads (934) are part of spacer (924).

As described herein, the spacer (924) of the sensor subassembly can have various constructions. In one embodiment, for example, the spacer (924) is formed as a solder mask on sensing element (922). In another embodiment, the spacer (924) is formed from a non-conductive or insulating material on sensing element (922). Any non-conductive or insulating material not inconsistent with the objectives of the present invention can be used. In some embodiments, a non-conductive or insulating material comprises liquid crystal polymer(s) (LCP), fiber reinforced plastics and/or other polymeric species.

In some embodiments, the spacer (924) comprises a composite construction of two or more materials. The composite construction, in some embodiments, comprises two or more materials coupled to one another. The spacer (924), in some embodiments, has a composite construction comprising a solder mask coupled to bond pads. In another embodiment, the spacer (924) has a composite construction comprising a solder mask coupled to a silicon spacing material. In some embodiments, a spacer (924) comprising a solder mask coupled to a silicon spacing material further comprises one or more bond pads coupled to the solder mask.

As illustrated in FIG. 9, spacer/holder (916) of the optical subassembly is coupled to spacer (924) of the sensor subassembly (904). The combined height of the optical subassembly spacer/holder (916) and the sensor subassembly spacer (924) can be set to any desired value. In some embodiments, for example, the combined height of an optical subassembly spacer/holder (916) and a sensor subassembly spacer (924) is set to provide the desired focal length or other optical parameter of the optical imaging apparatus (900). The focal length of an optical imaging apparatus, for example, can be determined with reference to the one or more optical surfaces of the optical subassembly.

In some embodiments, the combined height of an optical subassembly spacer/holder and a sensor subassembly spacer is at least about 1 mm. In other embodiments, the combined height of an optical subassembly spacer/holder and a sensor subassembly spacer is up to about 1 mm. In another, such as where the sensor size is sufficiently small or additional optical surfaces (not shown) are included in the lens design, the combined height of an optical subassembly spacer/holder and a sensor subassembly spacer ranges from about 250 µm to about 1.0 mm. In some embodiments, such as with larger sensors, the combined height of an optical subassembly spacer/holder and a sensor subassembly spacer ranges from about 1.0 mm to about 1.5 mm or from about 1.5 mm to about 2 mm. In a further embodiment, the combined height of an optical subassembly spacer/holder and a sensor subassembly spacer is less than about 250 µm or greater than about 2 mm.

As illustrated in FIG. 9, the optical imaging apparatus (900) can further comprise electrical circuitry (935) coupled to the sensor subassembly (904). In some embodiments, the electrical circuitry (935) coupled to the sensor assembly (904) is the same or substantially the same as that described for the optical imaging apparatus (100) of FIG. 1.

Turning now to components of optical imaging apparatus of the present invention, optical imaging apparatus of the present invention, in some embodiments, comprise a first optical subassembly comprising a radiation transmissive substrate comprising at least one optical surface. As provided herein, the radiation transmissive substrate, in some embodiments, comprises a plurality of optical surfaces.

In some embodiments, a radiation transmissive substrate comprises any suitable type of glass not inconsistent with the objectives of the present invention. In other embodiments, a radiation transmissive substrate comprises any polymeric or sol-gel material not inconsistent with the objectives of the present invention. In some embodiments, radiation transmissive polymeric materials include polycarbonates or polyacrylates such as polyacrylic acid, polymethacrylate, polymethylmethacrylate or mixtures thereof.

As described herein, the radiation transmissive substrate comprises one or a plurality of optical surfaces. In some embodiments, an optical surface comprises a lens or other refractive optical element operable to interact with electromagnetic radiation.

In some embodiments, for example, an optical surface comprises a convex, concave, spherical, or aspherical shape, including surfaces that are simultaneously concave in some regions and convex in others. In some embodiments, wherein opposing sides of the radiation transmissive substrate comprise optical surfaces, the opposing sides in combination form a biconvex, biconcave, plano-convex, plano-concave, positive meniscus or negative meniscus lens.

In some embodiments, an optical surface comprises a filter material operable to selectively pass or selectively block regions of the electromagnetic spectrum.

In some embodiments, optical surfaces on the radiation transmissive substrate comprise any of the glass or radiation transmissive polymeric materials described herein. Moreover, in some embodiments, optical surfaces are formed directly on the radiation transmissive substrate. In other embodiments, optical surfaces are formed independent of the radiation transmissive substrate and subsequently coupled or deposited on the radiation transmissive substrate.

In other embodiments, the optical subassemblies comprise optical surfaces that are formed without a substrate. In some embodiments, optical surfaces formed without a substrate are more uniform in cross-section, as demonstrated by some molded polymer or molded glass wafer optics.

An optical subassembly also comprises one or a plurality of spacers. A spacer of an optical subassembly can have any shape not inconsistent with the objectives of the present invention. In some embodiments, a spacer of an optical subassembly comprises substantially planar surfaces. In some embodiments, a spacer of an optical subassembly comprises one or more recessed regions or interiors operable to receive one or more optical elements. As described herein, in some embodiments, a spacer can have a shape operable to adjust the amount of electromagnetic radiation passing through the optical subassembly of the optical imaging apparatus. In some embodiments, the spacer can have shape operable to further restrict the amount of electromagnetic radiation passing through the optical subassembly. In other embodiments, the shape of the spacer does not further restrict the amount electromagnetic radiation passing through the optical subassembly.

Spacers of an optical subassembly can be constructed of any desired material not inconsistent with the objectives of the present invention. In some embodiments, a spacer of an optical subassembly comprises a fiber reinforced polymeric composite material. Fiber reinforced polymeric materials, in some embodiments, comprise glass fiber reinforced thermoplastic materials or glass fiber reinforced thermoset materials. In some embodiments, a spacer of an optical subassembly comprises a LCP. A LCP spacer may be formed by a variety of techniques including, without limitation, molding in a liquid form or sizing to a desired shape in a bulk solid form. In some embodiments, the material from which the spacer of an optical subassembly is constructed is operable to absorb one or more wavelengths of radiation thereby reducing scattered or stray light in the optical imaging apparatus.

In one embodiment, for example, a spacer of an optical subassembly comprises a glass fiber reinforced epoxy resin. In some embodiments, a glass fiber reinforced epoxy resin comprises FR-4. Certain formations of FR-4 are provided with different coefficients of thermal expansion (CTE) in different directions. For example, in one embodiment, the spacer material is characterized by relatively large coefficient of thermal expansion in a first direction and a substantially smaller coefficient of thermal expansion in a second substantially orthogonal direction. This difference in CTE may be as large as an order of magnitude (e.g., about 175 ppm/degree C. versus about 14 ppm/degree C. in orthogonal directions). In such cases, the spacer material may be oriented so that the least amount of thermal expansion occurs in a direction substantially parallel to the optical and sensor substrates (X-Y direction as shown in FIG. 1). A correspondingly larger thermal expansion will thus occur along the optical axis (Z direction as shown in FIG. 1). This particular configuration may help minimize stress at the adhesive junctions over temperature changes.

In one embodiment, the spacer in the optical subassembly is constructed of the same material as the spacer in the sensor subassembly. In one embodiment, the spacer in the optical subassembly is constructed of a different material as the spacer in the sensor subassembly. For example, the spacer in the optical subassembly may be chosen to have a coefficient of thermal expansion that closely matches that of the other materials in the optical subassembly. Likewise, the spacer in the sensor subassembly may be chosen to have a coefficient of thermal expansion that closely matches that of the other materials in the sensor subassembly. The spacer in the sensor subassembly, for example, may be silicon. In some embodiments, the spacers may be constructed of a material that has a coefficient of expansion that lies between that of the materials used in the optical subassembly and the materials used in the sensor subassembly.

In one or more embodiments, a spacer is adhered to the sensor and/or optical wafer. In other embodiments, the spacers may be formed onto the sensor and/or optical wafer using lithographic techniques. For example, a spacer may be formed of a solder mask material that is built up lithographically.

A spacer of an optical subassembly, in some embodiments, can have a desired height that, when coupled to a spacer of a sensor subassembly, produces a combined height having a value described herein.

Moreover, in some embodiments, an optical imaging apparatus of the present invention further comprises at least one additional optical subassembly comprising an additional radiation transmissive substrate comprising at least one optical surface and an additional spacer. The at least one additional optical subassembly is coupled to the first optical subassembly or an adjacent optical subassembly through the additional spacer. In some embodiments, the at least one additional optical subassembly comprises a plurality of additional spacers wherein the additional spacers are coupled to the first optical subassembly or an adjacent optical subassembly. Individual components of additional optical subassemblies, in some embodiments, are selected from any of the same described herein.

Figure 8:
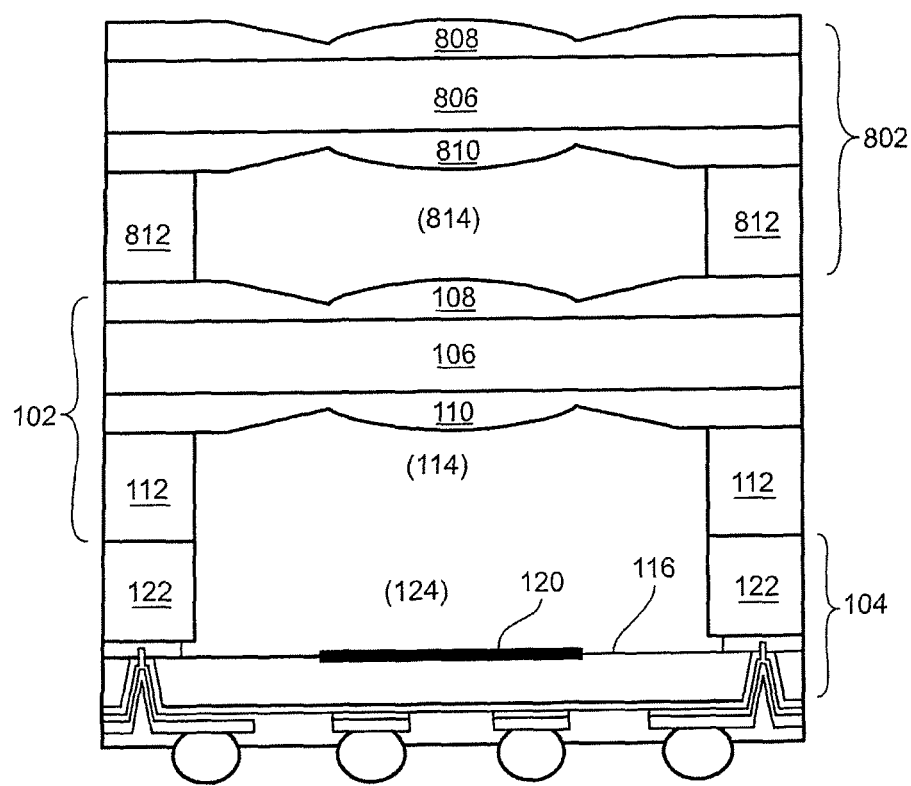
FIG. 8 illustrates an optical imaging apparatus according to one embodiment of the present invention.

FIG. 8 illustrates an optical imaging apparatus further comprising an additional optical subassembly comprising an additional radiation transmissive substrate comprising at least one optical surface and an additional spacer according to one embodiment of the present invention. The optical imaging apparatus (800) of FIG. 8 comprises a first optical subassembly (102) and a sensor subassembly (104). The first optical subassembly (102) comprises a radiation transmissive substrate (106) comprising a plurality of optical surfaces (108, 110). The first optical subassembly (102) also comprises a spacer (112). The spacer (112) comprises an aperture (114) aligned with the plurality of optical surfaces (108, 110). The sensor subassembly (104) comprises at least one sensing element (116) comprising a photosensitive region (120) and a spacer (122). The spacer (122) of the sensor wafer comprises an aperture (124) aligned with the sensing element (116) and photosensitive region (120).

The additional optical subassembly (802) comprises an additional radiation transmissive substrate (806) comprising a plurality of optical surfaces (808, 810). The additional optical subassembly (802) also comprises an additional spacer (812). The additional spacer (812) comprises an aperture (814) aligned with the plurality of optical surfaces (808, 810). The aperture (814) of the additional spacer (814) is also aligned with the plurality of optical surfaces (108, 110) of the first optical subassembly. The additional optical subassembly (802) is coupled to the first optical subassembly (102) through the additional spacer (812).

Figure 10:
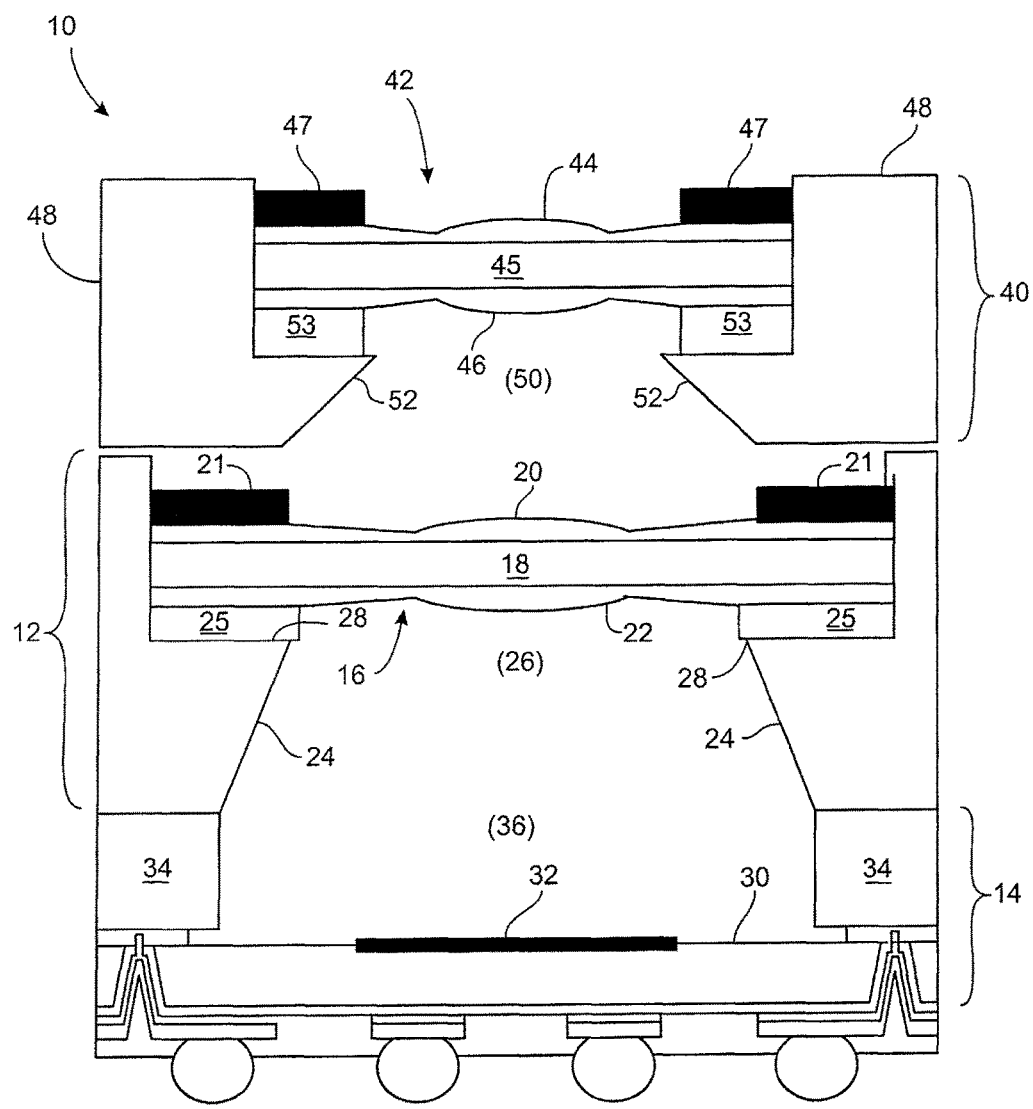
FIG. 10 illustrates an optical imaging apparatus according to one embodiment of the present invention.

FIG. 10 illustrates an optical imaging apparatus further comprising an additional optical subassembly comprising an additional radiation transmissive substrate comprising at least one optical surface and an additional spacer according to one embodiment of the present invention. The optical imaging apparatus (10) of FIG. 10 comprises a first optical subassembly (12) and a sensor subassembly (14). The first optical subassembly (12) comprises an optical element (16), the optical element (16) comprising a radiation transmissive substrate (18) having a plurality of optical surfaces (20, 22). A baffle (21) is disposed on optical surface (20). The first optical subassembly (12) also comprises a spacer (24) having an aperture (26) aligned with the plurality of optical surfaces (20, 22). In the embodiment illustrated in FIG. 10, spacer (24) additionally serves as a holder for the optical element (16). The spacer/holder (24) comprises a flange or projection (28) on which the optical element (16) is seated. The optical element (16) fits within the interior or recessed portion of the spacer/holder (24). In the embodiment illustrated in FIG. 10, a focus spacer (25), as described herein, is disposed between the optical element (16) and the spacer/holder (24).

The sensor subassembly (14) comprises at least one sensing element (30) comprising a photosensitive region (32). The sensor subassembly (14) also comprises a spacer (34) having an aperture (36) aligned with the photosensitive region (32) of the sensing element (30).

The additional optical subassembly (40) comprises an additional optical element (42) comprising a radiation transmissive substrate (45) having a plurality of optical surfaces (44, 46). A baffle (47) is disposed on optical surface (44). The additional optical subassembly (40) further comprises an additional spacer (48) having an aperture (50) aligned with the plurality of optical surfaces (44, 46). The aperture (50) of the additional spacer (48) is also aligned with the plurality of optical surfaces (20, 22) of the first optical subassembly (12). In the embodiment illustrated in FIG. 10, the additional spacer (48) serves as a holder for the additional optical element (42). The additional spacer (48) comprises a flange or projection (52) on which the optical element (42) is seated. The additional optical element (42) fits within the interior or recessed portion of the spacer/holder (48). In the embodiment illustrated in FIG. 10, a focus spacer (53) is disposed between the optical element (42) and the spacer/holder (48).

The additional optical subassembly is (40) is coupled to the first optical subassembly (12) through the additional spacer/holder (48).

In some embodiments, an optical subassembly of an optical imaging apparatus comprises a plurality of optical elements. In some embodiments, for example, a plurality of optical elements are coupled to the spacer of the optical subassembly.

Figure 11:
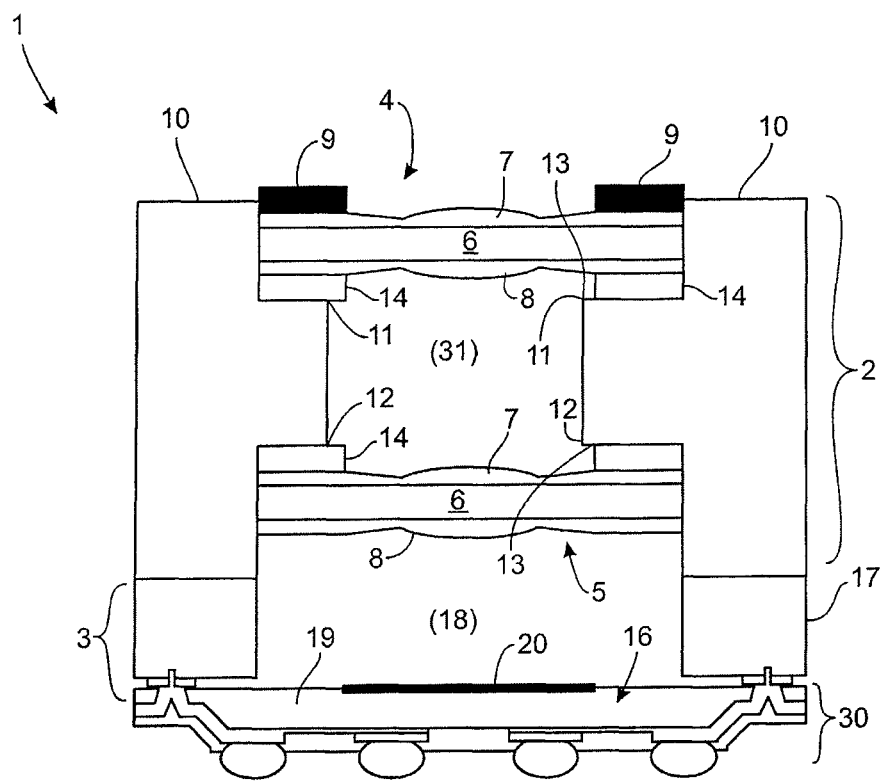
FIG. 11 illustrates an optical imaging apparatus according to one embodiment of the present invention.

FIG. 11 illustrates an optical imaging apparatus according to one embodiment of the present invention wherein a plurality of optical elements are coupled to the spacer of an optical subassembly. The optical imaging apparatus (1) of FIG. 11 comprises an optical subassembly (2) and a sensor subassembly (3). The optical subassembly (2) comprises a plurality of optical elements (4, 5), the optical elements (4, 5) comprising a radiation transmissive substrate (6) having a plurality of optical surfaces (7, 8). A baffle (9), in some embodiments, is disposed on optical surface (7) of optical element (4).

The optical subassembly (2) also comprises a spacer (10). The spacer (10) comprises an aperture (31) aligned with the plurality of optical surfaces (7, 8) of optical elements (4, 5) to permit the passage of radiation through the optical subassembly (2). In the embodiment illustrated in FIG. 11, the spacer (10) is additionally a holder for optical elements (4, 5). The spacer/holder (10), for example, comprises two recessed regions (11, 12) along an optical axis, each recessed region operable to receive an optical element. Each recess (11, 12) comprises a flange or projection (13) on which an optical element can be seated. As illustrated in FIG. 11, optical element (4) fits within recess (11) and optical element (5) fits within recess (12) to present the optical elements (4, 5) in a stacked configuration. Focus spacers (14) are disposed between optical elements (4, 5) and the spacer (10). In some embodiments, optical elements at least partially fit within recessed regions of the spacer/holder.

In some embodiments, spacer/holder (10) sets optical elements (4, 5) at the desired distance from one another. The monolithic or continuous structure of the spacer/holder (10), in some embodiments, can simplify construction of optical imaging apparatus comprising a plurality of optical elements by precluding or reducing the use of additional spacers associated with each optical element (4, 5).

In some embodiments, the spacer/holder (10) can have a shape operable to adjust the amount of radiation passing through the optical subassembly (2), thereby functioning as a baffle, light shield or aperture stop. In some embodiments, the spacer/holder (10) can have shape operable to further restrict the amount of radiation passing through the optical subassembly (2). In one embodiment, for example, the flange or projection (13) can function as a baffle to adjust the amount of radiation passing through the optical subassembly (2). Moreover, aperture (31) may have a circular, rectangular, elliptical or other shape formed by the flange or projection (13) to restrict the amount of radiation passing through the optical subassembly (2). In other embodiments, the shape of the spacer/holder (10) does not further restrict the amount radiation passing through the optical subassembly (2).

In some embodiments, the spacer/holder (10) provides or assists in providing the proper alignment of the optical elements (4, 5) with the photosensitive region (20) of the sensing element (16).

The sensor subassembly (3) of the optical imaging apparatus (1) comprises at least one sensing element (16) and a spacer (17) The spacer (17) of the sensor subassembly (3) comprises an aperture (18) aligned with the photosensitive region (20) of sensing element (16). In the embodiment illustrated in FIG. 11, the sensing element (16) comprises a semiconductor wafer (19) having a photosensitive region (20) operable to detect electromagnetic radiation received by the optical imaging apparatus (1). In comprising an aperture (18) aligned with the photosensitive region (20) of the sensing element (16), the spacer (17), in some embodiments, does not interfere with electromagnetic radiation passed by the optical elements (4, 5) to the photosensitive region (20). In other embodiments, the shape of the aperture (18) formed within spacer (17) may serve to restrict the amount of radiation passing through to the photosensitive region (20). Moreover, spacer (17) can have any construction described herein for a spacer of the sensing or optical subassembly.

As illustrated in FIG. 11, spacer/holder (10) of the optical subassembly (2) is coupled to spacer (17) of the sensor subassembly (3). The combined height of the optical subassembly spacer/holder (10) and the sensor subassembly spacer (17) can be set to any desired value. In some embodiments, for example, the combined height of an optical subassembly spacer/holder (10) and a sensor subassembly spacer (17) is set to provide the desired focal length or other optical parameter of the optical imaging apparatus (1). The focal length of an optical imaging apparatus, in some embodiments, can be determined with reference to the one or more optical surfaces of the optical subassembly.

In some embodiments, the sensor subassembly does not comprise a spacer (17) and the spacer/holder (10) of the optical subassembly (2) is coupled to the sensing element (16) or coverglass (not shown) of the sensing element (16). In such embodiments, the height of the spacer/holder (10) of the optical subassembly is set to provide the desired focal length or other optical parameter of the optical imaging apparatus (1).

As illustrated in FIG. 11, the optical imaging apparatus (1) can further comprise electrical circuitry (30) coupled to the sensor subassembly (3). In some embodiments, the electrical circuitry (30) coupled to the sensor assembly (3) is the same or substantially the same as that described for the optical imaging apparatus (100) of FIG. 1.

Turning now to various constructions of sensor subassemblies of optical imaging apparatus, a sensor subassembly comprises, in some embodiments, at least one sensing element and one or a plurality of spacers. In other embodiments, a sensor subassembly comprises at least one sensing element and does not comprise a spacer. As described herein, the sensing element comprises a photosensitive region operable to detect electromagnetic radiation received by the optical imaging apparatus. In some embodiments, the sensing element, including the photosensitive region, comprises a semiconductor. Any suitable semiconductor not inconsistent with the objectives of the present invention can be used for the sensing element, including the photosensitive region. In some embodiments, a semiconductor comprises a Group IV semiconductor, including silicon or any combination of Group IV elements. In another embodiment, a semiconductor comprises a Group III/V semiconductor or a Group II/VI semiconductor.

In some embodiments, the photosensitive region of a sensing element comprises a focal plane array. A focal plane array, in some embodiments, is a VGA sensor, comprising 640×480 pixels. In some embodiments, the sensor includes fewer pixels (e.g., CIF, QCIF), or more pixels (1 or more megapixel).

In one embodiment, a sensing element including the photosensitive region comprises a charge coupled device (CCD). In another embodiment, a sensing element including the photosensitive region comprises a complimentary metal oxide semiconductor (CMOS) architecture.

Spacers of the sensor subassembly can comprise any material not inconsistent with the objectives of the present invention. In some embodiments, spacers of the sensor subassembly comprise any of the semiconductor materials described herein.

As described herein, the spacer of the sensor subassembly can have various constructions. In one embodiment, for example, the spacer is formed as a solder mask on sensing element. In another embodiment, the spacer is formed from a non-conductive or insulating material on sensing element. Any non-conductive or insulating material not inconsistent with the objectives of the present invention can be used. In some embodiments, a non-conductive or insulating material comprises LCP(s), fiber reinforced plastics and/or other polymeric species.

In some embodiments, the spacer comprises a composite construction of two or more materials. The composite construction, in some embodiments, comprises two or more materials coupled to one another. The spacer, in some embodiments, has a composite construction comprising a solder mask coupled to bond pads. In another embodiment, the spacer has a composite construction comprising a solder mask coupled to a silicon spacing material. In some embodiments, a spacer comprising a solder mask coupled to a silicon spacing material further comprises one or more bond pads coupled to the solder mask.

In some embodiments, optical imaging apparatus of the present invention comprise solid state camera modules. As provided herein, solid state camera modules of the present invention can be used in a variety of products including cell phone cameras, digital cameras, toys, computers and automotive driver aids.

In another aspect, the present invention provides methods of making optical imaging apparatus. As described further herein, methods of the present invention, in some embodiments, can overcome disadvantages of prior serial manufacturing practices by providing a plurality of individual optical imaging apparatus through wafer assembly and singulation techniques.

In one embodiment, a method of making a plurality of individual optical imaging apparatus comprises providing a wafer comprising a plurality of optical subassemblies, the optical subassemblies comprising a radiation transmissive substrate having at least one optical surface and a spacer and providing a sensor wafer comprising a plurality of sensor subassemblies, the sensor subassemblies comprising a sensing element and a spacer. The spacers of the optical subassemblies are coupled to the spacers of the sensor subassemblies to provide a plurality of joined optical imaging apparatus. The plurality of joined optical imaging apparatus are singulated to provide the plurality of individual optical imaging apparatus.

Figure 2:
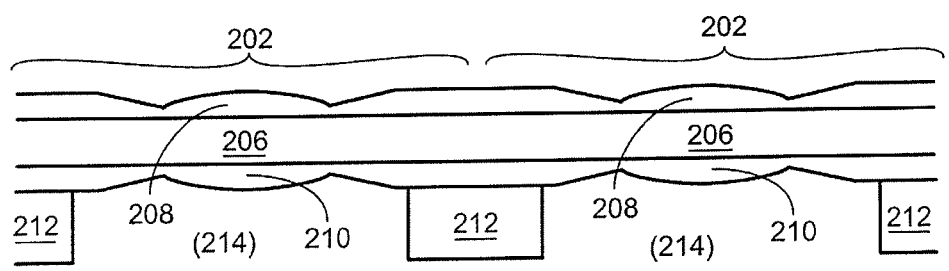
FIG. 2 illustrates a wafer comprising a plurality of optical subassemblies according to one embodiment of the present invention.

Referring once again to the figures, FIG. 2 illustrates an optical wafer comprising a plurality of optical subassemblies. The plurality of optical subassemblies (202) comprise a radiation transmissive substrate (206) comprising a plurality of optical surfaces (208, 210). In the embodiment illustrated in FIG. 2, the optical wafer serves as the radiation transmissive substrate (206) having the optical surfaces (206, 208) deposited thereon. The optical subassemblies (202) further comprise a spacer (212) having an aperture (214) substantially aligned with the optical surfaces (208, 210). In some embodiments, the spacer (212) is provided as a spacer wafer coupled to the optical wafer comprising the radiation transmissive substrate (206) having optical surfaces (206, 208). In other embodiments, the spacer (212) is continuous with the optical wafer comprising the radiation transmissive substrate (206) having optical surfaces (206, 208) to provide a monolithic structure.

As described herein, in other embodiments, the optical subassemblies comprise optical surfaces that are formed without a substrate. In some embodiments, optical surfaces formed without a substrate are more uniform in cross-section, as demonstrated by some molded polymer or molded glass wafer optics.

In some embodiments, the spacer (212) is provided as a spacer wafer comprising a plurality of apertures (214). The apertures (214) of the spacer wafer are aligned with the optical surfaces (206, 208) on the optical wafer (206). The spacer wafer is subsequently coupled to the optical wafer (216) comprising the optical surfaces (208, 210) to provide a wafer comprising a plurality of optical subassemblies.

Figure 3:
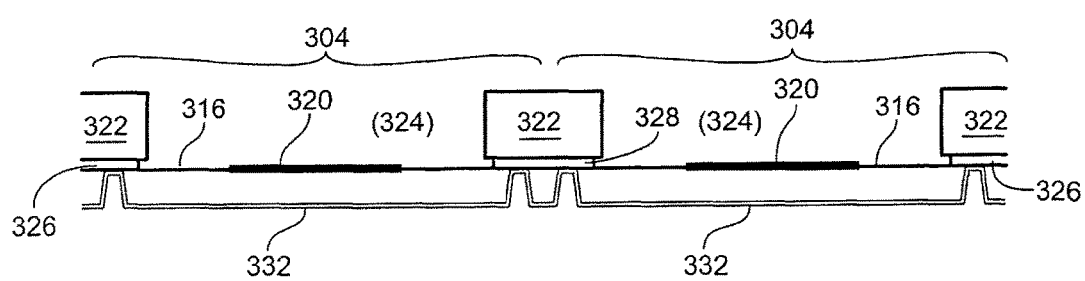
FIG. 3 illustrates a sensor wafer comprising a plurality sensor subassemblies according to one embodiment of the present invention.

FIG. 3 illustrates a sensor wafer comprising a plurality of sensor subassemblies according to one embodiment of the present invention. The plurality of sensor subassemblies (304) comprise a sensing element (316) comprising a photosensitive region (320) and a spacer (322) having an aperture (324) substantially aligned with the photosensitive region (320) of the sensing element (316).

In some embodiments, the spacer (322) is provided as a spacer wafer comprising a plurality of apertures (324). The apertures (324) of the spacer wafer are substantially aligned with the photosensitive regions (320) of the sensor wafer. The spacer wafer is subsequently coupled to the sensor wafer comprising the photosensitive regions (320) to provide a wafer comprising a plurality of sensor subassemblies.

In some embodiments, the spacer (322) is coupled to the sensing element (316) of the spacer wafer by bond pads (326, 328). In the embodiment illustrated in FIG. 3, the sensor wafer serves as the sensing element (316) for the plurality of optical subassemblies (304). An insulating layer, such as electrophoretic coating (332) resides on the surface of the sensing element (304) opposite photosensitive region (320).

Figure 4:
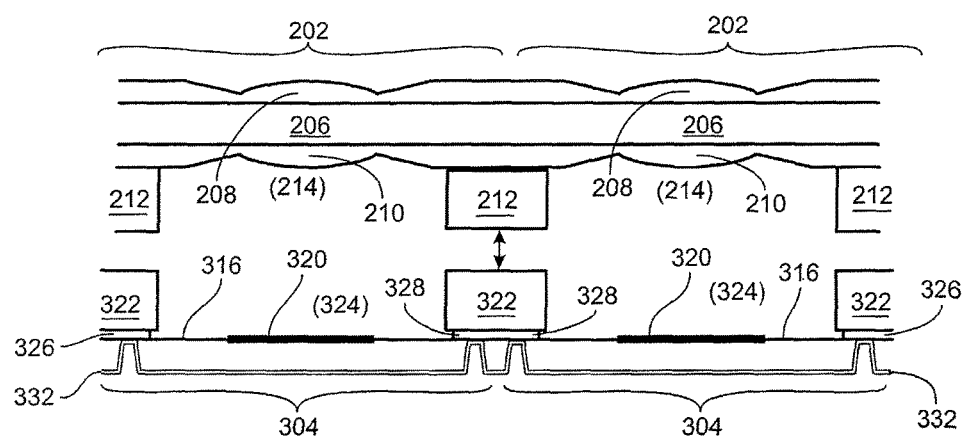
FIG. 4 illustrates aligning a spacer of optical subassemblies with a spacer of sensor subassemblies in the production of an optical imaging apparatus according to one embodiment of the present invention.
Figure 5:
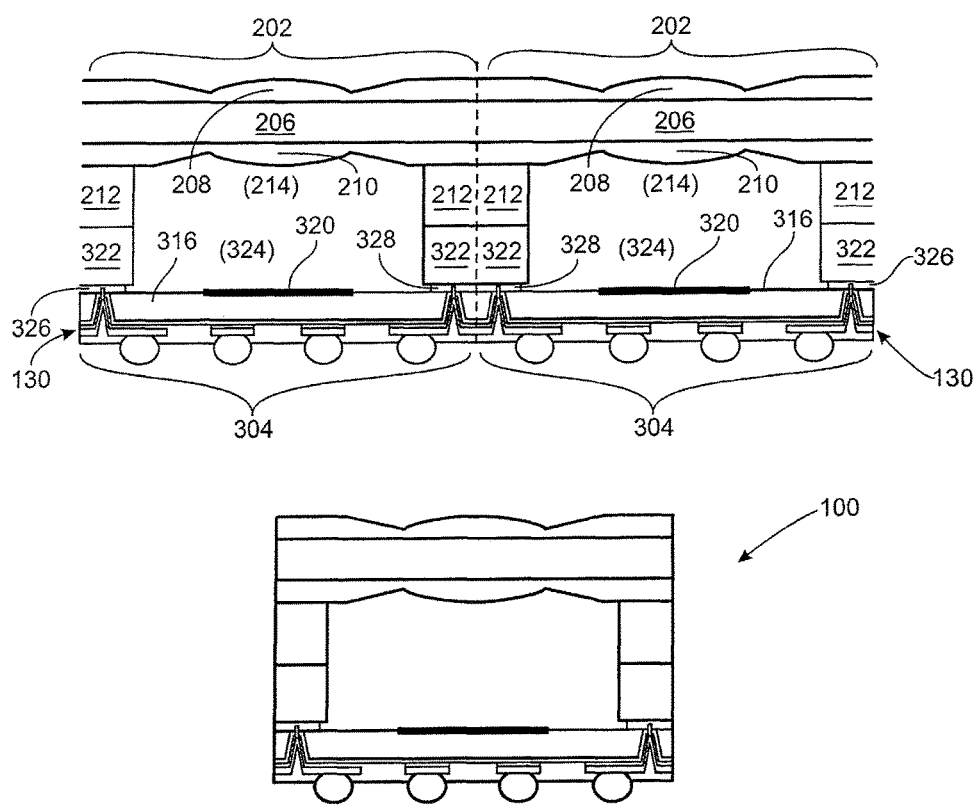
FIG. 5 illustrates coupling a spacer of optical subassemblies to a spacer of sensor subassemblies in the production of a plurality of joined optical imaging apparatus and singulating the plurality of joined optical imaging apparatus according to one embodiment of the present invention.

In some embodiments, a plurality of joined optical imaging apparatus can be formed by coupling the wafer comprising the plurality of optical subassemblies with the sensor wafer comprising the plurality of sensor subassemblies according to FIGS. 4 and 5. As illustrated in FIG. 4, the optical subassembly spacer (212) is aligned with the sensor subassembly spacer (322). Once aligned, the optical subassembly spacer (212) is coupled to the sensor subassembly spacer (322) to provide a plurality of joined optical imaging apparatus as shown in FIG. 5.

Aligning the optical subassembly spacer (212) with the sensor subassembly spacer (322) additionally aligns optical surfaces (208, 210) on the radiation transmissive substrate (206) with the photosensitive region (320) of the sensing element (316). Alternatively, alignment fiducials (not shown) on the radiation transmissive substrate (206) may be aligned to corresponding fiducials on the sensing element (316).

Furthermore, the electrical circuitry (430) for each optical imaging apparatus can be constructed on the sensor subassembly (304) before or after coupling of the optical subassembly spacer (212) and the sensor subassembly spacer (322). In one embodiment, the optical subassemblies (202) and sensor subassemblies (304) are aligned and bonded together after the insulating layer (332) is applied on the surface of the sensing element (304) opposite photosensitive region (320) but before metal portions of the electrical circuitry (430) are formed on the sensor subassemblies (304).

Additionally, as illustrated in FIG. 5, the plurality of joined optical imaging apparatus, in some embodiments, are singulated along the coupled optical subassembly (212) spacer and sensor subassembly (322) spacer to provide a plurality of individual optical imaging apparatus (100). Singulation of the joined optical imaging apparatus can be achieved by any method that preserves the optical, structural and electrical integrities of the optical imaging apparatus. Generally known techniques include dicing and laser ablation. A combination of dicing techniques or steps may be used. For instance, a first dicing cut may be applied from a top side of the joined wafers cutting through the optical subassembly (202). A second dicing cut may be applied from a bottom side of the joined wafers, cutting through the sensor subassembly (304) to completely separate the individual optical imaging apparatus (100). In some embodiments, the plurality of individual optical imaging apparatus comprise solid state cameras as described herein.

In another embodiment, a method of making a plurality of individual optical imaging apparatus comprises providing a wafer comprising a plurality of optical subassemblies, the optical subassemblies comprising a radiation transmissive substrate having at least one optical surface and singulating the plurality of optical subassemblies. The singulated optical subassemblies are subsequently coupled to one another with a spacer. A sensor wafer is provided comprising a plurality of sensor subassemblies, the sensor subassemblies comprising a sensing element and a spacer. The spacers of the optical subassemblies are coupled to the spacers of the sensor subassemblies to provide a plurality of joined optical imaging apparatus. The joined optical imaging apparatus are singulated to provide a plurality of individual optical imaging apparatus.

Figure 6:
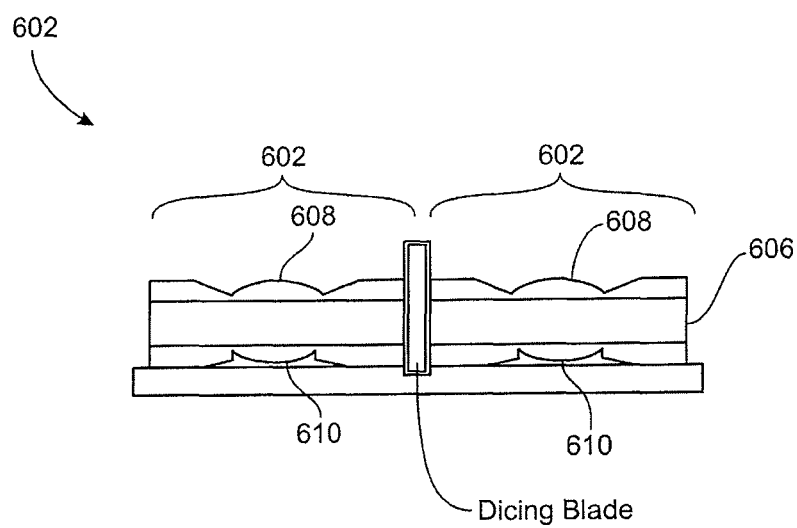
FIG. 6 illustrates singulation of a plurality of optical subassemblies according to one embodiment of the present invention.

Referring once again to the figures, FIG. 6 illustrates singulation of a plurality of optical subassemblies according to one embodiment of the present invention. As provided herein, the plurality of optical subassemblies (602) comprise a radiation transmissive substrate (606) comprising a plurality of optical surfaces (608, 610). In the embodiment illustrated in FIG. 6, an optical wafer serves as the radiation transmissive substrate (606) having the optical surfaces (608, 610) deposited thereon. The plurality of optical subassemblies can be singulated by any method that preserves the optical and structural integrities of the optical subassemblies. In FIG. 6, the optical subassemblies (602) are singulated by a dicing blade.

In some embodiments, singulating the plurality of optical subassemblies prior to association with sensor subassemblies permits testing of the optical subassemblies to ensure the subassemblies demonstrate the desired performance. In such embodiments, optical subassemblies failing performance testing are discarded before coupling with sensor subassemblies. Likewise, known good optical subassemblies may be omitted from bad sensor subassemblies, thereby increasing cost efficiencies and lowering levels of defective optical imaging apparatus.

Figure 7A:
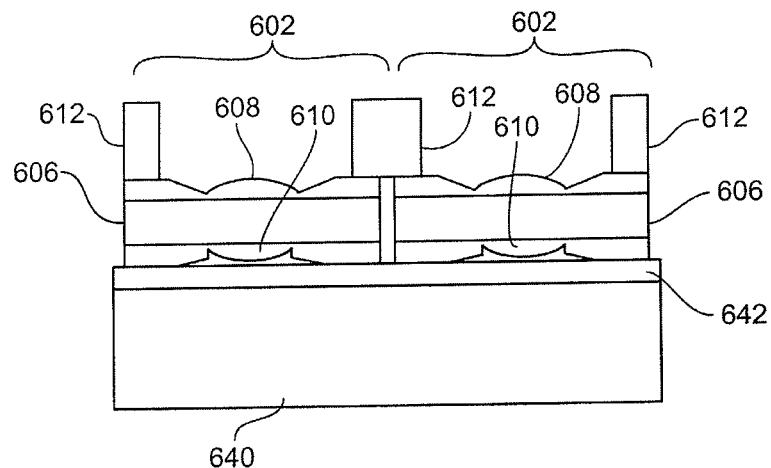
FIGS. 7(a) and 7(b) illustrate singulated optical subassemblies coupled by a spacer according to one embodiment of the present invention.
Figure 7B:
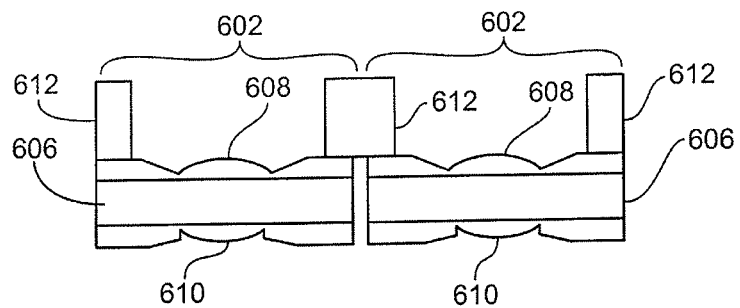

Subsequent to singulation and optional performance testing, the optical subassemblies, in some embodiments, are coupled to one another with a spacer. FIGS. 7(a) and 7(b) illustrate singulated optical subassemblies coupled by a spacer according to one embodiment of the present invention. In some embodiments, the spacer to which singulated optical subassemblies are coupled is a spacer wafer. In the embodiment illustrated in FIG. 7(a), the plurality of singulated optical subassemblies (602) are disposed on a carrier (640) with an adhesive layer (642). The carrier (640) can stabilize and fix the singulated optical subassemblies (602) at the desired spacing from one another prior to coupling with a spacer (612).

Once coupled with the spacer (612), the optical subassemblies (602), in some embodiments, are removed from the carrier (640) as displayed in FIG. 7(b). In one embodiment, the plurality of singulated optical subassemblies (602) are disposed on a spacer (612) without the use of a carrier (640). In either case, the optical subassemblies (602) can subsequently be coupled to sensor subassemblies in the production of optical imaging apparatus as described herein.

In another embodiment, a method of making a plurality of individual optical imaging apparatus comprises providing a plurality of optical elements, providing a spacer wafer comprising a plurality of recesses and at least partially disposing the plurality of optical elements in the plurality of recesses of the spacer wafer. Disposing an optical element in the recess of the spacer wafer provides an optical subassembly. Disposing a plurality of optical elements in the plurality of recesses of the spacer wafer provides a plurality of joined optical subassemblies. In some embodiments, an optical subassembly comprises optical elements in a stacked configuration. Optical elements, in some embodiments, are singulated optical elements.

As described herein, in some embodiments, an optical element comprises a radiation transmissive substrate comprising one or more optical surfaces. In other embodiments, an optical element comprises one or more optical surfaces are not supported on a radiation transmissive substrate. In some embodiments wherein optical surfaces are not supported by a radiation transmissive substrate, the optical surfaces are part of a monolithic structure as in the case, for example, of molded polymeric or glass optical wafers.

The use of singulated optical elements prior to association with the spacer wafer to provide optical subassemblies, in some embodiments, permits testing of the optical elements to ensure the optical elements demonstrate the desired performance. In such embodiments, optical elements failing performance testing are discarded before disposition in a recess of the spacer wafer. Likewise, known good optical elements and resulting optical subassemblies may be omitted from bad sensor subassemblies, thereby increasing cost efficiencies and lowering levels of defective optical imaging apparatus.

A sensor wafer comprising a plurality of sensing elements is provided. A spacer wafer is coupled to the sensor wafer to provide a plurality of sensor subassemblies, a sensor subassembly comprising a sensing element and a spacer as described herein. The spacer wafer of the optical subassemblies is coupled to the spacer wafer of the sensor subassemblies to provide a plurality of joined optical imaging apparatus. The joined optical imaging apparatus are singulated to provide a plurality of optical imaging apparatus. In some embodiments of methods of the present invention, a spacer of an optical subassembly and/or a spacer of a sensor subassembly can comprise one or more grooves to facilitate singulation processes.

Figure 12:
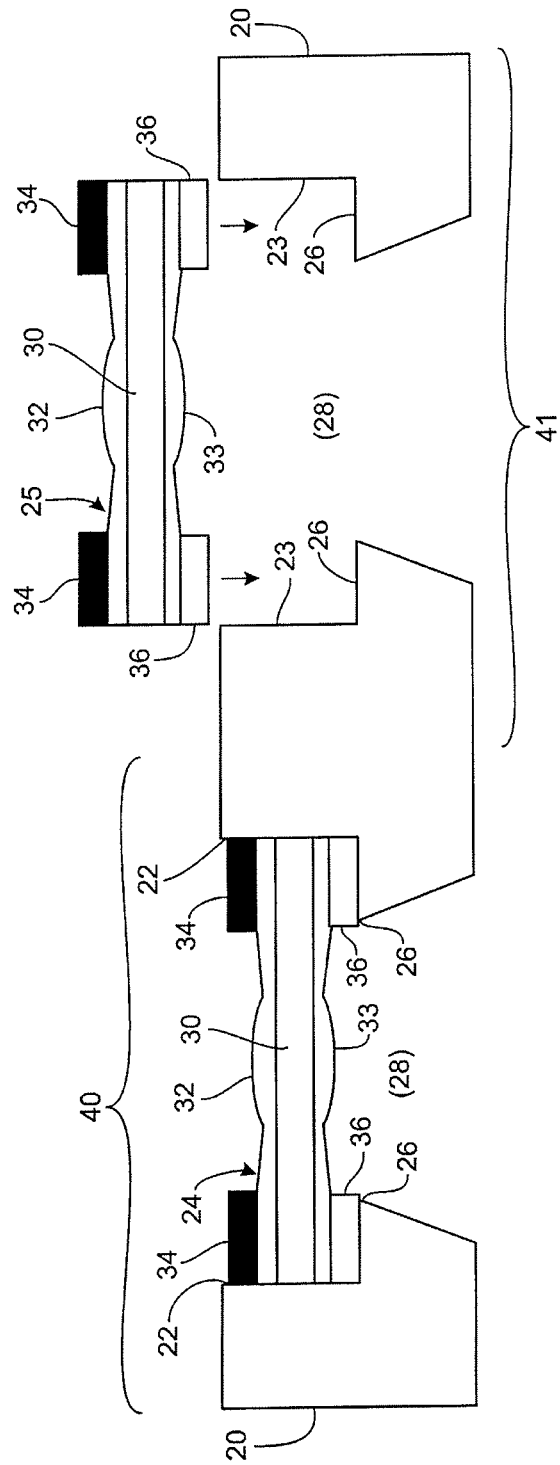
FIG. 12 illustrates disposition of optical elements in recesses of a spacer wafer to provide a plurality of joined optical subassemblies according to one embodiment of the present invention.

Referring once again to the figures, FIG. 12 illustrates disposition of optical elements in recesses of a spacer wafer to provide a plurality of joined optical subassemblies according to one embodiment of the present invention. As illustrated in FIG. 12, the spacer wafer (20) comprises a plurality of recesses (22, 23) for receiving optical elements (24, 25). Recesses (22, 23) comprise a flange or projection (26) on which an optical element can be seated. The flange or projection (26) also defines or assists in defining an aperture (28) through which radiation can pass. As described herein, the flange or projection (26) of the spacer wafer (20), in some embodiments, can have a shape operable to restrict the amount of radiation passing through spacer wafer (20).

In the embodiment illustrated in FIG. 12, optical elements (24, 25) each comprise a radiation transmissive substrate (30) having a plurality of optical surfaces (32, 33). In other embodiments, optical surfaces of an optical element are not supported by a radiation transmissive substrate. A baffle (34) is disposed on optical surface (32) of optical elements (24, 25).

Optical element (24) is disposed in recess (22) of the spacer wafer (20) and seated on flange or projection (26). As described herein, a focus spacer (36) is disposed between optical element (24) and flange or projection (26). When seated in recess (22), optical surfaces (32, 33) of optical element (24) align with the aperture (28) provided by flange or projection (26).

Optical element (25) is positioned to be disposed in recess (23) of the spacer wafer. In the embodiment illustrated in FIG. 12, a focus spacer (38) is attached to optical element (25). Disposition of optical element (25) in recess (24) provides a plurality of joined optical subassemblies (40, 41).

In some embodiments, optical elements are disposed in recesses of a spacer wafer in a serial manner. In other embodiments, optical elements are disposed in recesses of a spacer wafer simultaneously or substantially simultaneously.

Moreover, in some embodiments, at least one additional spacer wafer comprising one or more optical elements disposed in recesses of the additional wafer can be coupled to spacer wafer (20) to provide optical subassemblies in a stacked configuration. In one embodiment, a plurality of optical subassemblies arranged in a stacked configuration is illustrated in FIG. 10.

Figure 13:
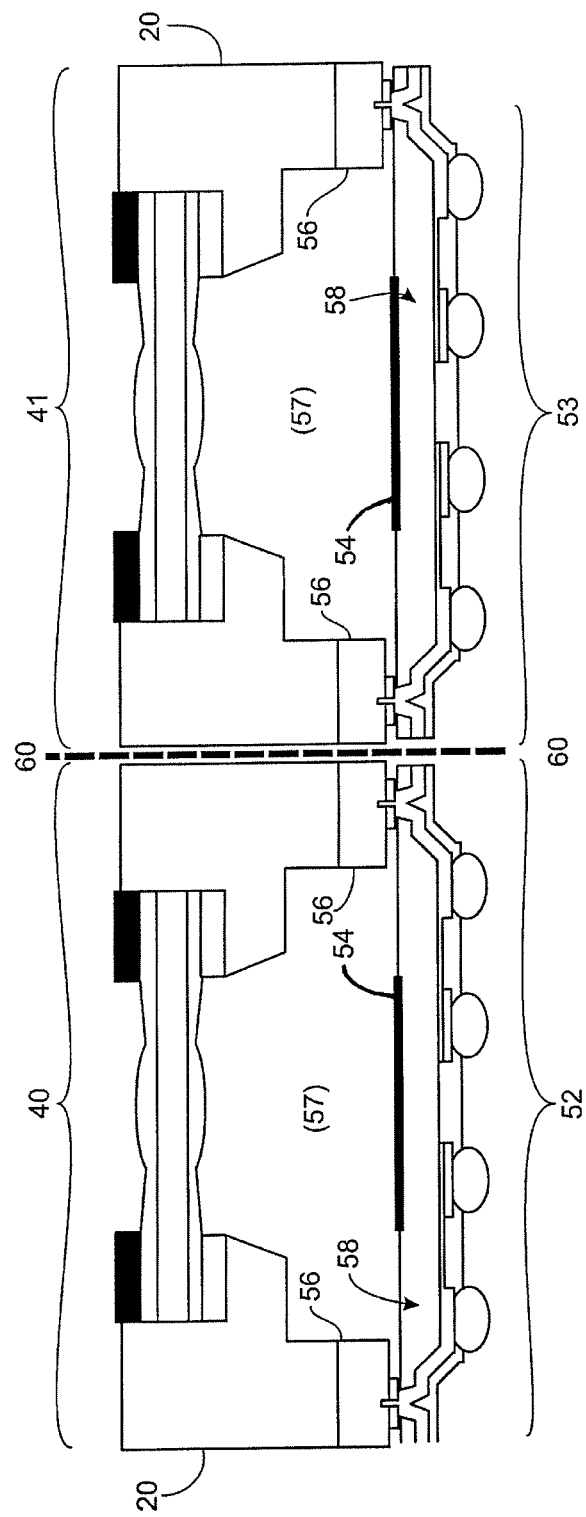
FIG. 13 illustrates singulation of a plurality of joined optical imaging apparatus according to one embodiment of the present invention.

Referring now to FIG. 13, a sensor wafer comprising a plurality of joined sensor subassemblies (52, 53) is provided. Sensor subassemblies (52, 53) comprise a sensing element (54) and a spacer (56). As described herein, the spacer (56) comprises an aperture (57) aligned with the sensing element (54). In some embodiments, spacer (56) is provided as a spacer wafer coupled sensor wafer (58), the sensor wafer (58) comprising the plurality of sensing elements (54).

The spacer wafer (20) of the joined optical subassemblies (40, 41) is coupled to the spacer wafer (56) of the joined sensor subassemblies (52, 53) to provide a plurality of joined optical imaging apparatus. Joined optical imaging apparatus are singulated along singulation axis (60) to provides a plurality of optical imaging apparatus.

Figure 14:
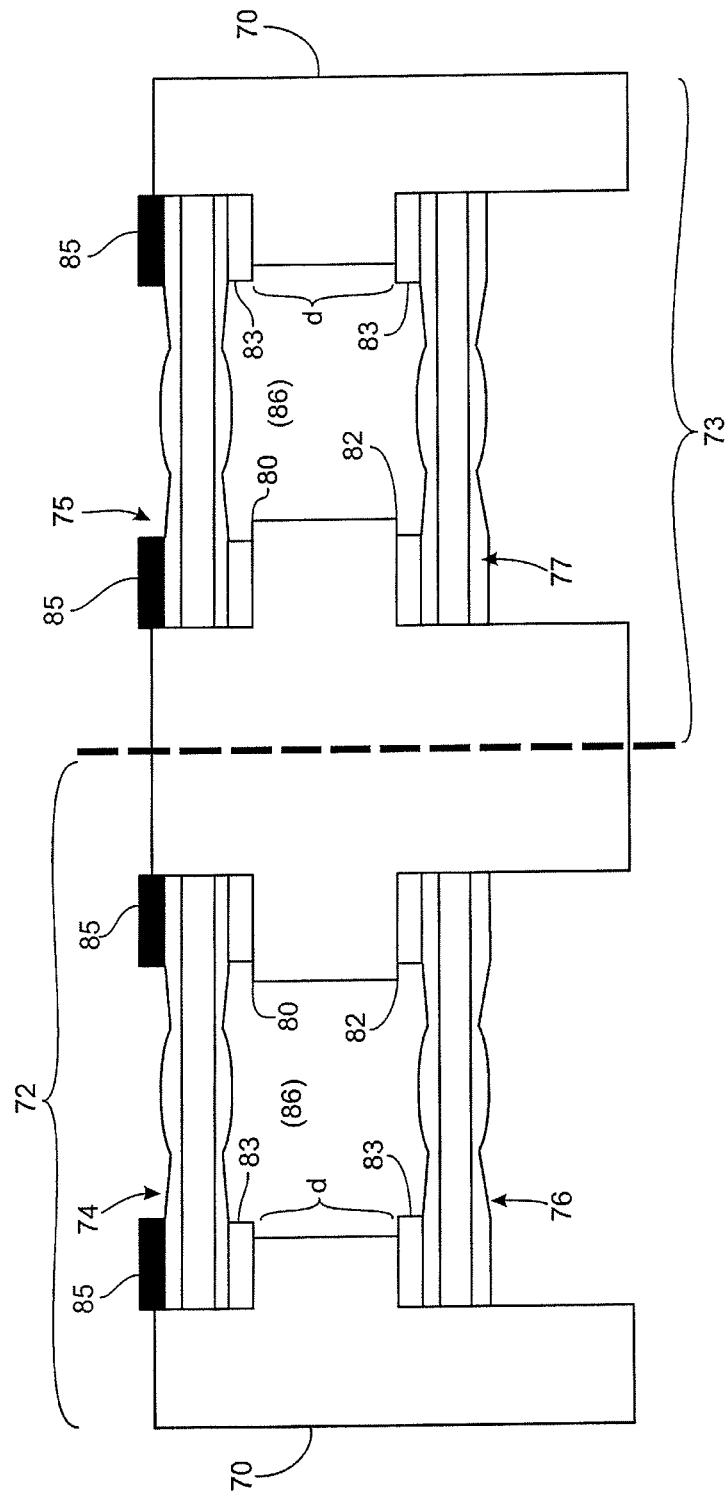
FIG. 14 illustrates disposition of optical elements in recesses of a spacer wafer to provide a plurality of joined optical subassemblies according to one embodiment of the present invention.

In another embodiment, a plurality of optical elements of an optical subassembly can be arranged in a stacked configuration using a single spacer wafer. FIG. 14 illustrates a plurality of joined optical subassemblies comprising a plurality of optical elements in a stacked configuration provided by a single spacer wafer according to one embodiment of the present invention.

As illustrated in FIG. 14, a single spacer wafer (70) is used to provide optical subassemblies (72, 73) having a stacked configuration of optical elements. For each optical subassembly (72, 73), the spacer wafer (70) provides two recessed regions (80, 82) operable to receive an optical element. In some embodiments, the use of a single spacer (70) facilitates setting optical elements at a fixed distance (d) from one another. The fixed distance (d) between optical elements, in some embodiments, is translated across each optical subassembly provided by the spacer wafer (70), thereby producing a plurality of optical subassemblies having uniform construction. In the embodiment illustrated in FIG. 14, for example, spacer (70) sets optical elements (74, 76) of optical subassembly (72) a fixed distance (d) from one another. Spacer (70) also sets optical elements (75, 77) of optical subassembly (73) the same fixed distance (d) from one another.

In the embodiment illustrated in FIG. 14, optical elements (74, 75) can be disposed and secured in recesses (80) of optical subassemblies (72, 73). Moreover, optical elements (76, 77) can be disposed and secured in recesses (82). Optical elements (74, 75, 76, 77) can be disposed in recesses of spacer (70) in any desired order and/or manner. In some embodiments, optical elements (74, 75, 76, 77) are simultaneously disposed in recesses of spacer (70). In some embodiments, optical elements (74, 75) are simultaneously or sequentially disposed in recesses (80). Optical elements (76, 77), in some embodiments, are simultaneously or sequentially disposed in recesses (82).

As described herein, in some embodiments, focus spacers (83) are disposed between spacer (70) and optical elements (74, 75, 76, 77). Additionally, optical elements (74, 75) can have baffles (85) on one or more optical surfaces. Spacer wafer (70) provides an aperture (86) for each optical subassembly (72, 73) permitting the passage of radiation. In some embodiments, spacer (70) has a shape operable to further restrict the amount of radiation passing through the optical subassemblies (72, 73).

Figure 15:
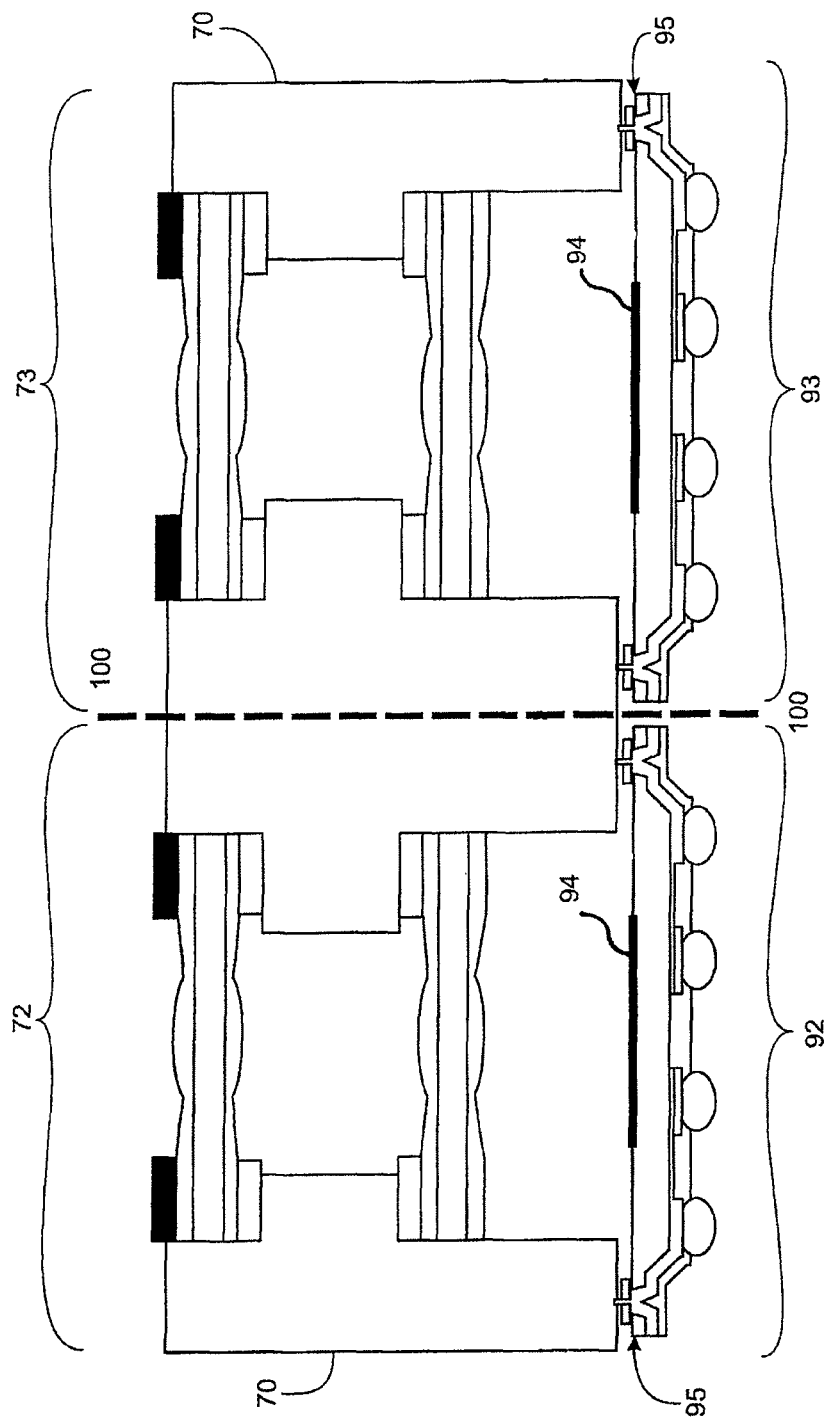
FIG. 15 illustrates singulation of a plurality of joined optical imaging apparatus according to one embodiment of the present invention.

Referring now to FIG. 15, a sensor wafer (95) comprising a plurality of joined sensor subassemblies (92, 93) is provided. Sensor subassemblies (92, 93) comprise a sensing element (94) of the sensor wafer (95). In the embodiment illustrated in FIG. 15, the spacer (70) of joined optical subassemblies (72, 73) of FIG. 14 is coupled to the sensor wafer (95) or associated coverglass of the joined sensor subassemblies (92, 93) to provide a plurality of joined optical imaging apparatus. In coupling to the sensor wafer or the associated coverglass of the joined sensor subassemblies (92, 93), the spacer (70) of the joined optical subassemblies (72, 73), in some embodiments, is not coupled to a spacer of the sensor subassemblies (92, 93).

Alternatively, in some embodiments, the joined sensor subassemblies (92, 93) comprise a spacer to which the spacer (70) of the joined optical subassemblies (72, 73) is coupled to provide a plurality of joined optical imaging apparatus.

Joined optical imaging apparatus are singulated along singulation axis (100) to provide a plurality of optical imaging apparatus.

In another aspect, the present invention provides a method of imaging a scene. In one embodiment, a method of imaging a scene comprises providing an optical imaging apparatus comprising a first optical subassembly comprising a radiation transmissive substrate comprising at least one optical surface and a spacer and a sensor subassembly comprising at least one sensing element and a spacer, wherein the spacer of the first optical subassembly is coupled to the spacer of the sensor subassembly and receiving electromagnetic radiation from the scene. The received electromagnetic radiation passes through the first optical subassembly and is detected by the sensing element. The sensing element translates the received electromagnetic radiation into an electrical response for constructing an electronic image of the scene. In some embodiments of imaging a scene, the optical imaging apparatus comprises a solid state camera.

Various embodiments of the invention have been described in fulfillment of the various objectives of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. An optical imaging apparatus comprising:
   a first optical subassembly comprising:
      a radiation transmissive substrate;
      a first optical layer provided on the radiation transmissive substrate;
      a second optical layer, wherein the radiation transmissive substrate is disposed between the first and second optical layers; and
      a first spacer constructed of a material operable to absorb one or more wavelengths of electromagnetic radiation passing through the first optical subassembly,
      wherein the first spacer of the first optical subassembly comprises an aperture,
      wherein the second optical layer is coupled to a top surface of the first spacer of the first optical subassembly and disposed between the radiation transmissive substrate and the first spacer, and
      wherein the radiation transmissive substrate and the first and second optical layers are disposed above the top surface of the first spacer; and
   a sensor subassembly comprising at least one sensing element and a second spacer comprising a composite construction of two or more materials coupled to one another wherein the second spacer of the sensor subassembly comprises an aperture such that the second spacer does not interfere with the electromagnetic radiation passing from the first and second optical layers to the at least one sensing element;
   wherein the second optical layer is disposed on an inner side of the radiation transmissive substrate facing the sensor subassembly and the top surface of the first spacer,
   wherein the second optical layer comprises a first curved portion that forms a convex surface extending away from the radiation transmissive substrate,
   wherein the second optical layer further comprises flat portions coupled to the top surface of the first spacer and a tapered portion on each side of the first curved portion and tapering toward the radiation transmissive substrate in a direction toward the first curved portion, each tapered portion being adjacent to one of the flat portions, the first curved portion being adjacent to each tapered portion,
   wherein a surface of the first curved portion farthest away from the radiation transmissive substrate is above the top surface of the first spacer,
   wherein the first spacer of the first optical subassembly is coupled to the second spacer of the sensor subassembly, and
   wherein the first and second optical layers are configured to focus the electromagnetic radiation at or near the at least one sensing element.

2. The optical imaging apparatus of claim 1, wherein the first optical layer is disposed on an outer side of the radiation transmissive substrate and comprises a second curved portion that forms a convex surface extending away from the radiation transmissive substrate, and wherein the first curved portion and the second curved portion are configured to focus the electromagnetic radiation on the at least one sensing element.

3. The optical imaging apparatus of claim 1, wherein the first spacer of the first optical subassembly is a singulated section of an optical subassembly spacer wafer, wherein the second spacer of the sensor subassembly is a singulated section of a sensor subassembly spacer wafer.

4. The optical imaging apparatus of claim 1, wherein the first spacer of the first optical subassembly comprises a recess in which the second optical layer is seated.

5. The optical imaging apparatus of claim 4, wherein a focus spacer is disposed between a flange of the recess and the radiation transmissive substrate.

6. The optical imaging apparatus of claim 4, wherein the first spacer of the first optical subassembly partially restricts an amount of the electromagnetic radiation passing through the first optical subassembly.

7. The optical imaging apparatus of claim 1, wherein the at least one sensing element is a singulated section of a sensing element wafer.

8. The optical imaging apparatus of claim 1, further comprising electrical circuitry coupled to the at least one sensing element of the sensor subassembly, wherein the two or more materials are selected from the group consisting of a solder mask, an insulating material and a silicon material.

9. The optical imaging apparatus of claim 1, wherein a height of the first spacer of the first optical subassembly in conjunction with a height of the second spacer of the sensor subassembly sets a focal point of the first and second optical layers at or near a plane of the at least one sensing element.

10. The optical imaging apparatus of claim 1 further comprising at least one additional optical subassembly, the at least one additional optical subassembly comprising an additional radiation transmissive substrate comprising at least one additional optical layer and an additional spacer.

11. An optical imaging apparatus comprising:
   an optical subassembly comprising a plurality of optical elements including a first optical layer and a second optical layer, wherein the first optical layer is provided on a radiation transmissive substrate, wherein the radiation transmissive substrate is disposed between the first and second optical layers, wherein the second optical layer is coupled to a top surface of a first spacer and disposed between the radiation transmissive substrate and the first spacer, wherein the radiation transmissive substrate and the first and second optical layers are disposed above the top surface of the first spacer, and wherein the first spacer is constructed of a material operable to absorb one or more wavelengths of electromagnetic radiation passing through the optical subassembly; and
   a sensor subassembly comprising at least one sensing element and a second spacer defining an aperture through which electromagnetic radiation passes from the plurality of optical elements to the at least one sensing element, wherein the first spacer of the optical subassembly is directly coupled to the second spacer of the sensor subassembly, wherein the second optical layer is disposed on an inner side of the radiation transmissive substrate facing the sensor subassembly and the top surface of the first spacer, wherein the second optical layer comprises a curved portion that forms a convex surface extending away from the radiation transmissive substrate, wherein the second optical layer further comprises flat portions coupled to the top surface of the first spacer and a tapered portion on each side of the curved portion and tapering toward the radiation transmissive substrate in a direction toward the curved portion, wherein each tapered portion is adjacent to one of the flat portions, wherein the curved portion is adjacent to each tapered portion, and wherein a surface of the curved portion farthest away from the radiation transmissive substrate is above the top surface of the first spacer, wherein a height of the first spacer of the optical subassembly and a height of the second spacer of the sensor subassembly provide a combined height of the first spacer and the second spacer, wherein the combined height sets a focal point of the optical subassembly at or near a plane of the at least one sensing element, such that the first and second optical layers are configured to focus electromagnetic radiation at or near the at least one sensing element.

12. The optical imaging apparatus of claim 11, wherein the first spacer of the optical subassembly comprises at least one recess in which one of the optical elements is at least partially disposed.

13. The optical imaging apparatus of claim 11, wherein the first spacer of the optical subassembly comprises a plurality of recesses in which the optical elements are at least partially disposed.

14. The optical imaging apparatus of claim 11, wherein the plurality of optical elements are arranged in a stacked configuration.

15. The optical imaging apparatus of claim 11, wherein the first spacer of the optical subassembly is a singulated section of an optical subassembly spacer wafer.

16. The optical imaging apparatus of claim 11, wherein the second spacer of the sensor subassembly is a singulated section of a sensor subassembly spacer wafer.

17. The optical imaging apparatus of claim 11, wherein the at least one sensing element is a singulated section of a sensing element wafer.

18. A method of making a plurality of individual optical imaging apparatus comprising:
  providing a wafer comprising a plurality of optical subassemblies, the optical subassemblies comprising:
    a first spacer;
    a radiation transmissive substrate;
    a first optical layer provided on the radiation transmissive substrate; and
    a second optical layer, wherein the radiation transmissive substrate is disposed between the first and second optical layers, wherein the second optical layer is disposed between the radiation transmissive substrate and the first spacer and coupled to a top surface of the first spacer, and wherein the radiation transmissive substrate and the first and second optical layers are disposed above the top surface of the first spacer;
  providing a sensor wafer comprising a plurality of sensor subassemblies, the sensor subassemblies comprising a sensing element and a second spacer, the first and second optical layers configured to focus electromagnetic radiation at or near the sensing element, wherein the second optical layer is disposed on an inner side of the radiation transmissive substrate facing the sensor wafer and the top surface of the first spacer of the optical subassemblies, wherein the second optical layer comprises a curved portion that forms a convex surface extending away from the radiation transmissive substrate, wherein the second optical layer further comprises flat portions coupled to the top surface of the first spacer of the optical subassemblies and a tapered portion on each side of the curved portion and tapering toward the radiation transmissive substrate in a direction toward the curved portion, wherein each tapered portion is adjacent to one of the flat portions, wherein the curved portion is adjacent to each tapered portion, and wherein a surface of the curved portion farthest away from the radiation transmissive substrate is above the top surface of the first spacer of the optical subassemblies;
  coupling the first spacer of the optical subassemblies to the second spacer of the sensor subassemblies to provide a plurality of joined optical imaging apparatus; and
  singulating the joined optical imaging apparatus.

19. A method of making a plurality of individual optical imaging apparatus comprising:
  providing a wafer comprising a plurality of optical subassemblies, the optical subassemblies comprising:
    a radiation transmissive substrate;
    a first optical layer provided on the radiation transmissive substrate; and
    a second optical layer, wherein the radiation transmissive substrate is disposed between the first and second optical layers, wherein the second optical layer comprises a curved portion that forms a convex surface extending away from the radiation transmissive substrate;
  singulating the optical subassemblies;
  coupling the optical subassemblies to a first spacer, such that the second optical layer is disposed between the radiation transmissive substrate and the first spacer and coupled to a top surface of the first spacer and the radiation transmissive substrate and the first and second optical layers are disposed above the top surface of the first spacer, wherein a surface of the curved portion farthest away from the radiation transmissive substrate is above the top surface of the first spacer, wherein the second optical layer further comprises flat portions coupled to the top surface of the first spacer and a tapered portion on each side of the curved portion and tapering toward the radiation transmissive substrate in a direction toward the curved portion, wherein each tapered portion is adjacent to one of the flat portions, and wherein the curved portion is adjacent to each tapered portion;
  providing a sensor wafer comprising a plurality of sensor subassemblies, the sensor subassemblies comprising a sensing element and a second spacer, the first and second optical layers configured to focus electromagnetic radiation at or near the sensing element, wherein the second optical layer is disposed on an inner side of the radiation transmissive substrate facing the sensor wafer and the top surface of the first spacer of the optical subassemblies;
  coupling the first spacer of the optical subassemblies to the second spacer of the sensor subassemblies to provide a plurality of joined optical imaging apparatus; and
  singulating the joined optical imaging apparatus.

20. A method of imaging a scene comprising:
  providing an optical imaging apparatus comprising a first optical subassembly comprising:
    a first spacer;
    a radiation transmissive substrate;
    a first optical layer provided on the radiation transmissive substrate; and
    a second optical layer coupled to a top surface of the first spacer, wherein the radiation transmissive substrate is disposed between the first and second optical layers, wherein the second optical layer is disposed between the radiation transmissive substrate and the first spacer, and wherein the radiation transmissive substrate and the first and second optical layers are disposed above the top surface of the first spacer;

providing a sensor subassembly comprising at least one sensing element and a second spacer comprising an aperture, wherein the first spacer of the first optical subassembly is directly coupled to the second spacer of the sensor subassembly to establish a combined height of the first spacer and the second spacer and wherein the combined height establishes an overall spacing between the first and second optical layers and the at least one sensing element, wherein the second optical layer is disposed on an inner side of the radiation transmissive substrate facing the sensor subassembly and the top surface of the first spacer, wherein the second optical layer comprises a curved portion that forms a convex surface extending away from the radiation transmissive substrate, wherein the second optical layer further comprises flat portions coupled to the top surface of the first spacer and a tapered portion on each side of the curved portion and tapering toward the radiation transmissive substrate in a direction toward the curved portion, wherein each tapered portion is adjacent to one of the flat portions, wherein the curved portion is adjacent to each tapered portion, and wherein a surface of the curved portion farthest away from the radiation transmissive substrate is above the top surface of the first spacer; and receiving electromagnetic radiation from the scene by the at least one sensing element wherein the combined height of the first spacer and the second spacer sets a focal point of the electromagnetic radiation at or near a plane of the at least one sensing element such that the first and second optical layers focus the electromagnetic radiation at or near the at least one sensing element and wherein the second spacer defines an aperture such that the second spacer does not interfere with the electromagnetic radiation passing from the first and second optical layers to the at least one sensing element.

21. The method of claim 20, further comprising translating the received electromagnetic radiation into an electrical response for constructing an electronic image of the scene.

22. An optical imaging apparatus comprising:

a first optical subassembly comprising a first spacer of a spacer wafer,
  wherein the first spacer comprises a plurality of recessed regions along an optical axis and an optical element disposed in each recessed region,
  wherein the optical element comprises:
    a radiation transmissive substrate;
    a first optical layer provided on the radiation transmissive substrate; and
    a second optical layer coupled to top surfaces of the recessed regions and disposed between the radiation transmissive substrate and the recessed regions, wherein the radiation transmissive substrate is disposed between the first and second optical layers, and wherein the radiation transmissive substrate and the first and second optical layers are disposed above the top surfaces of the recessed regions; and a first sensor subassembly comprising a first sensing element of a sensing element wafer, wherein the first optical subassembly is coupled to the first sensor subassembly, such that the first and second optical layers are configured to focus electromagnetic radiation at or near the first sensing element, wherein the second optical layer is disposed on an inner side of the radiation transmissive substrate facing the first sensor subassembly and a top surface of the first spacer, wherein the second optical layer comprises a curved portion that forms a convex surface extending away from the radiation transmissive substrate, wherein the second optical layer further comprises flat portions coupled to the top surface of the first spacer and a tapered portion on each side of the curved portion and tapering toward the radiation transmissive substrate in a direction toward the curved portion, wherein each tapered portion is adjacent to one of the flat portions, wherein the curved portion is adjacent to each tapered portion, and wherein a surface of the curved portion farthest away from the radiation transmissive substrate is above the top surface of the first spacer.

23. The optical imaging apparatus of claim 22, wherein the first spacer is a singulated spacer and the first sensing element is a singulated sensing element.

24. The optical imaging apparatus of claim 22, wherein the recessed regions are on opposite sides of the first spacer.

25. The optical imaging apparatus of claim 22 further comprising a second optical subassembly comprising a second spacer of the spacer wafer and a second sensor subassembly comprising a second sensing element of the sensing element wafer, wherein the second spacer is continuous with the first spacer.

26. The optical imaging apparatus of claim 22, wherein the optical elements are singulated optical elements from an optical wafer.

27. The optical imaging apparatus of claim 11, wherein the second spacer of the sensor subassembly comprises a composite construction of two or more materials coupled to one another.

28. The optical imaging apparatus of claim 1, wherein the aperture of the second spacer of the sensor subassembly comprises a shape to restrict an amount of radiation passing through the optical subassembly.

29. The optical imaging apparatus of claim 1, wherein a height of the first spacer of the first optical subassembly and a height of the second spacer of the sensor subassembly provide a combined height of the first spacer and the second spacer, and wherein the combined height establishes an overall spacing between the first and second optical layers and the at least one sensing element and sets a focal point of the first and second optical layers at or near a plane of the at least one sensing element.

30. The optical imaging apparatus of claim 1, wherein a first portion of each flat portion is contacting the top surface of the first spacer and a second portion of each flat portion is not contacting the top surface of the first spacer.

* * * * *

UNITED STATES PATENT AND TRADEMARK OFFICE
CERTIFICATE OF CORRECTION

Page 1 of 1

PATENT NO. : 10,147,750 B2
APPLICATION NO. : 13/145830
DATED : December 4, 2018
INVENTOR(S) : Moshe Kriman et al.

It is certified that error appears in the above-identified patent and that said Letters Patent is hereby corrected as shown below:

In the Specification

In the Detailed Description:
In Column 6, Line 33, change "is fixated" to --is formed--.

Signed and Sealed this
Fifth Day of March, 2019

Andrei Iancu
*Director of the United States Patent and Trademark Office*